(12) United States Patent
Berke

(10) Patent No.: US 8,553,469 B2
(45) Date of Patent: Oct. 8, 2013

(54) MEMORY BUFFER FOR BUFFER-ON-BOARD APPLICATIONS

(75) Inventor: Stuart Allen Berke, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 186 days.

(21) Appl. No.: 13/080,720

(22) Filed: Apr. 6, 2011

(65) Prior Publication Data
US 2012/0257459 A1 Oct. 11, 2012

(51) Int. Cl.
*G11C 7/00* (2006.01)

(52) U.S. Cl.
USPC .................................. 365/189.02

(58) Field of Classification Search
USPC .................................. 365/189.02
See application file for complete search history.

(56) References Cited

U.S. PATENT DOCUMENTS

| | | | |
|---|---|---|---|
| 5,398,252 A | 3/1995 | Ohashi | |
| 5,970,074 A | 10/1999 | Ehiro | |
| 6,457,148 B1 | 9/2002 | Yoshiba | |
| 7,975,192 B2 * | 7/2011 | Sommer et al. | 714/719 |
| 2004/0196026 A1 | 10/2004 | Bolz | |
| 2005/0253658 A1 | 11/2005 | Maeda et al. | |
| 2008/0025383 A1 | 1/2008 | Li | |
| 2009/0122634 A1 | 5/2009 | Kang | |
| 2009/0207664 A1 | 8/2009 | Kim et al. | |
| 2009/0303802 A1 | 12/2009 | Lee | |
| 2010/0005220 A1 | 1/2010 | Loughner et al. | |
| 2010/0118639 A1 | 5/2010 | Kang | |
| 2010/0226185 A1 | 9/2010 | Lee | |
| 2011/0141098 A1 | 6/2011 | Yaguma et al. | |
| 2012/0239887 A1 * | 9/2012 | Magro et al. | 711/154 |
| 2012/0254472 A1 * | 10/2012 | Ware et al. | 710/3 |

* cited by examiner

*Primary Examiner* — Hoai V Ho
*Assistant Examiner* — Pablo Huerta
(74) *Attorney, Agent, or Firm* — Haynes and Boone, LLP

(57) ABSTRACT

The present disclosure involves an apparatus. The apparatus includes a decoder that receives an input command signal as its input and generates a first output command signal as its output. The apparatus includes a register component that receives the input command signal as its input and generates a second output command signal as its output. The apparatus further includes a multiplexer that receives a control signal as its control input and receives both the first output command signal and the second output command signal as its data input, the multiplexer being operable to route one of the first and second output command signals to its output in response to the control signal.

16 Claims, 13 Drawing Sheets

MEMORY BUFFER FOR BUFFER-ON-BOARD APPLICATIONS

BACKGROUND

The present disclosure relates generally to information handling systems, and more particularly to a memory buffer.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs include memory buffers that can serve as an interface between a Central Processing Unit (CPU) and memory devices such as Single In-line Memory Module (SIMM) devices or Dual In-line Memory Module (DIMM) devices. Among other things, memory buffers facilitate management and routing of various signals, such as control signals and/or address signals. However, existing memory buffers may suffer from shortcomings such as cost, lack of flexibility, and inefficient performance. Accordingly, it would be desirable to provide an improved memory buffer.

SUMMARY

According to one embodiment, the present disclosure involves an apparatus. The apparatus includes: a decoder that receives an input command signal as its input and generates a first output command signal as its output; a register component that receives the input command signal as its input and generates a second output command signal as its output; and a multiplexer that receives a control signal as its control input and receives both the first output command signal and the second output command signal as its data input, the multiplexer being operable to route one of the first and second output command signals to its output in response to the control signal.

According to another embodiment, the present disclosure involves a method. The method includes: generating, using a decoder, a first output command signal in response to an input command signal; generating, using a register component, a second output command signal in response to the input command signal; and selecting one of the first output command signal and the second output command signal to be outputted in response to a control signal.

According to yet another embodiment, the present disclosure involves a digital apparatus. The digital apparatus includes: a decoder component that maps an input command signal to a first output command signal according to a predefined decoding table; means for mapping the input command signal to a second output command signal; and a multiplexer that selects either the first output command signal or the second output command signal to be outputted in response to a control signal.

According to a further embodiment, the present disclosure involves a method. The method includes: assigning a first value to the voltage reference signal; executing a test pattern while using the voltage reference signal having the first value; observing whether a failure occurs in response to the executing and thereafter recording a pass/fail result; incrementing the voltage reference signal by a second value; repeating the executing, the observing, and the incrementing a plurality of times until the voltage reference signal exceeds a third value; and determining an optimized value for the voltage reference signal based on the pass/fail results obtained through the repeating the executing, the observing, and the incrementing the plurality of times.

According to a further embodiment, the present disclosure involves a method. The method includes: iterating a first loop that contains a plurality of first cycles, wherein a respective pass/fail result is obtained for each first cycle by executing a test pattern; iterating a second loop that contains a plurality of second cycles, wherein each of the second cycles correspond to a respective iteration of the entire first loop; wherein the iterating the first loop and the iterating the second loop are carried out in one of the following manners: the test pattern remains the same but the voltage reference signal is adjusted by a step size for each of the first cycles during the iterating of the first loop, and the test pattern changes for each of the second cycles during the iterating of the second loop; and the voltage reference signal remains the same but the test pattern changes for each of the first cycles during the iterating of the first loop, and the voltage reference signal is adjusted by the step size for each of the second cycles during the iterating of the second loop.

According to a further embodiment, the present disclosure involves a digital apparatus. The digital apparatus includes a memory buffer having means for carrying out a voltage reference training algorithm. The training algorithm includes the following: iterating a first loop that contains a plurality of first cycles, wherein a respective pass/fail result is obtained for each cycle by executing a test pattern; iterating a second loop that contains a plurality of second cycles, wherein each of the second cycles correspond to a respective iteration of the first loop; wherein the iterating the first loop and the iterating the second loop are carried out in one of the following manners: the test pattern remains the same but the voltage reference signal is adjusted by a step size for each of the first cycles during the iterating of the first loop, and the test pattern changes for each of the second cycles during the iterating of the second loop; and the voltage reference signal remains the same but the test pattern changes for each of the first cycles during the iterating of the first loop, and the voltage reference signal is adjusted by the step size for each of the second cycles during the iterating of the second loop.

DETAILED DESCRIPTION

It is to be understood that the following disclosure provides many different embodiments, or examples, for implementing different features of the present disclosure. Specific examples of components and arrangements are described below to simplify the present disclosure. These are, of course, merely examples and are not intended to be limiting. Various components may be arbitrarily drawn in different scales for the sake of simplicity and clarity.

In addition, for purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, a mobile communication devices, or any other suitable device. The IHS may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
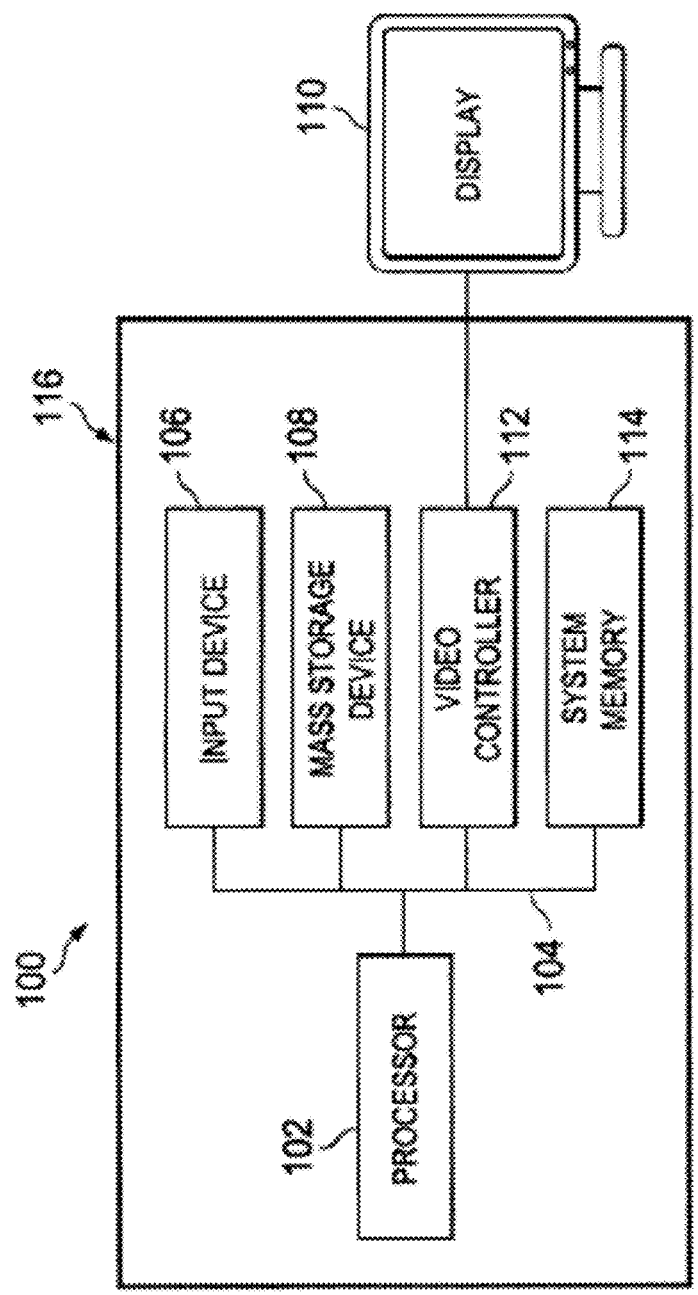
FIG. 1 is a simplified block diagram of an example information handling system.

In one embodiment, an IHS 100 shown in FIG. 1 includes a processor 102, which is connected to a bus 104. Bus 104 serves as a connection between processor 102 and other components of IHS 100. An input device 106 is coupled to processor 102 to provide input to processor 102. Examples of input devices may include keyboards, touch-screens, pointing devices such as mouses, trackballs, and track-pads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
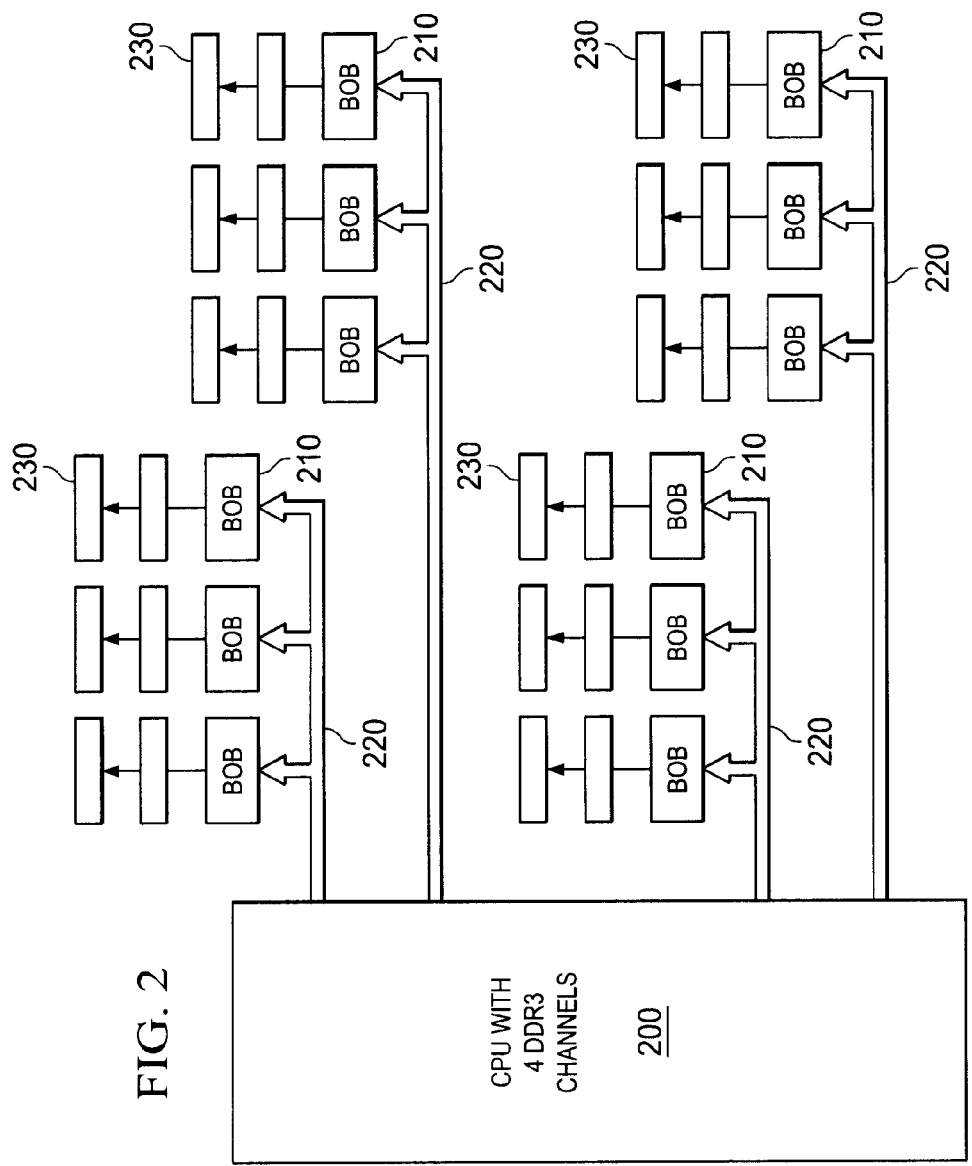
FIG. 2 is an example implementation scheme of memory buffers according to various aspects of the present disclosure.

The present disclosure involves a memory buffer that serves as an interface between the processor 102 and the system memory 114. Referring to FIG. 2, an example implementation scheme of memory buffers according to the various aspects of the present disclosure is illustrated. As is shown in FIG. 2, an example CPU 200 is coupled to a plurality of memory buffers 210 (also referred to as buffer-on-board, or BoB) through a plurality of buses 220. The memory buffers 210 may each be implemented as an extended chipset component on a motherboard, a riser, or a mezzanine. Each memory buffer 210 is coupled to a plurality of downstream memory devices 230. The memory devices 230 include DIMM devices in one embodiment, but may include any other suitable memory devices according to other embodiments. Also, it is understood that although FIG. 2 only shows two memory devices 230 behind each memory buffer 210, this is done for the sake of simplicity, and that other numbers of memory devices (for example four or eight) may be coupled to each memory buffer 210 in other embodiments. In addition, for the discussions below, the terms processor, CPU, host, or memory controller may be used interchangeably to designate the upstream device that sends signals to the memory buffer as inputs. Likewise, memory devices and DIMMs may be used interchangeably to designate the downstream device that accepts the signals from the memory buffer.

The need to have memory buffers in IHSs is at least in part driven by the rapid technological advances in computing devices. For example, as the number of cores increase in CPUs, the number of supportable threads and Virtual Machines (VMs) increase as well, and the size of the threads/applicationsNMs increase correspondingly. As a result, there is increased pressure to increase the capacity and performance of the memory subsystem with cost-effective commodity memory devices that offer efficient resource allocation, which can be measured in terms of dollars-per-gigabyte (GB) of memory. For instance, the cost of a standard 8 GB DRx4 RDIMM today is about $25/GB, the cost of a 16 GB RDIMM is about $37/GB, and the cost of a 32 GB RDIMM is about $125/GB.

Although the specific price-to-memory ratios for each type of memory device may vary, the above example illustrates that it is increasingly expensive to implement a memory subsystem with one or two "large" (in terms of memory capacity) memory devices. Rather, it is much more cost-effective to accomplish the same goal using a plurality of "smaller" memory devices that together offer the same (or better) memory capacity as the one or two "large" memory devices. In other words, it is desirable to enable servers with greater numbers of memory sockets in order to be able to provide memory capacity at the lowest cost. Thus, one of the advantages of the memory buffers (such as memory buffers 210) of the present disclosure is that each memory buffer can support and manage a plurality of memory devices while reporting or "spoofing" to the CPU that there is only one single "large"

memory device behind each memory buffer. Stated differently, from the CPU's perspective, it is as if there is only a single memory device behind each memory buffer, even though there are actually a plurality of memory devices implemented behind each memory buffer. In addition, this plurality of memory devices may be different types and may even come from different manufacturers. This type of implementation allows for easy memory management and cost savings.

In one embodiment, the memory buffers of the present disclosure utilize various features of the Joint Electron Devices Engineering Council (JEDEC, also known as JEDEC Solid State Technology Association) standard for Load Reduced DIMM (LRDIMM) memory buffers while offering various improvements over the LRDIMM memory buffers according to the JEDEC standard. Table 1 below lists examples of such improvements according to an embodiment of the present disclosure:

TABLE 1

| Improvement Categories | Added Functionalities over JEDEC Memory Buffer Specification | Reasons For Improvement and Limitations of Standard JEDEC Memory Buffers |
|---|---|---|
| RDIMM and LRDIMM Enablement | Control Word Writes with Arbitrary QCSA/B3:0 assertion | Allows support for RDIMMs and LRDIMMs. Standard JEDEC memory buffer does not support Control Word Writes required on RDIMMs and LRDIMMs. Supports "3T"/"3N" timing during control word writes (like host) to setup and hold times and allow CA/Clock margining. |
| | Parity Signal Output for RDIMMs and LRDIMMs | Allows support for RDIMMs and LRDIMMs. Allows support (Restore) for Address/Control Parity Checking at RDIMMs and LRDIMMs for Robust RAS, eliminate SDC. Standard buffer does not pass Host Parity to DIMMs. Parity generation needed when BoB is sending self-generated commands to the DIMM: Membist, DRAM bus calibration algorithm, MRS commands, DRAM Opcode/RCW Parity Forwarding Logic is needed for: Aligning Parity input -> output with QCxxx command to DIMMS, Entering 3T timing mode on Parity output for MRS commands If Address inversion is used, a second Parity output pin is required to allow the 'B' address/control parity to be correct/valid. |
| Improved DIMM Population Flexibility | Arbitrary mapping of DCKE1:0 to QCKEA/B1:0 | Allows support for Flexible DIMM Population behind BoB (0/1R, 0/2R, 0/4R, 1R/1R, 2R/2R, 4R/4R). Standard buffer mapping does not support arbitrary DIMM types to be populated as would be true on a host channel. |
| | Arbitrary mapping of DCS1:0 to QCSA/B3:0 | Allows support for Flexible DIMM Population behind BoB (0/1R, 0/2R, 0/4R, 1R/1R, 2R/2R, 4R/4R). Standard buffer mapping does not support arbitrary DIMM types to be populated as would be true on a host channel |
| | A16/A17 Pass-through mode to allow Rank Multiplication on BoB and LRDIMMs | Allows support for Rank Multiplication on LRDIMMs behind a buffer that exceed A15 row address. These include Octal Rank 2 Gb and 4 Gb based LRDIMMs (16 GB & 32 GB & 64 GB) and Quad rank 4 Gb based LRDIMMs (16 GB & 32 GB). Standard buffer does not support passing the encoded A16/A17 signals to the DRAM/DIMM interface. Supports cascading of memory buffers to allow: extra implementation flexibility, allow DIMMs to be placed physically further away from the memory controller; improve signal integrity |
| Improved Performance | Independent QA/BODT1:0 Controls | Improves DDR3 SI and Channel margins to support 1333 MT/s and higher operation to DIMMs. Standard Buffer only supports 2 independent ODTs, and 2 are used per DIMM for optimal termination. |
| | Programmable VREF outputs and Internal VREF generators | Utilizes buffer's programmable VREF Outputs to replace external VRs (Cost and Board space savings). Also required to optimize all receiver eyes. Standard buffer does not include necessary range, step size, linearity, etc. to perform optimal DIMM rank margining and training. Five independent Vref generators: Host side writes: VrefDQ, VrefCA DIMM side writes: QVrefDQ, QVrefCA, DIMM side reads: VrefDQ |

TABLE 1-continued

| Improvement Categories | Added Functionalities over JEDEC Memory Buffer Specification | Reasons For Improvement and Limitations of Standard JEDEC Memory Buffers |
|---|---|---|
| | Incorporate VREF margining into DRAM Side Training Algorithm | Improves training speed and system margining (10x speed-up), thus improving DDR3 SI and Channel margins to support 1333 MT/s and higher operation to DIMMs. Standard buffer does not include any Vref margining in DRAM side training. |

Each of these added functionalities listed in Table 1 will be discussed in more detail below.

Figure 3:
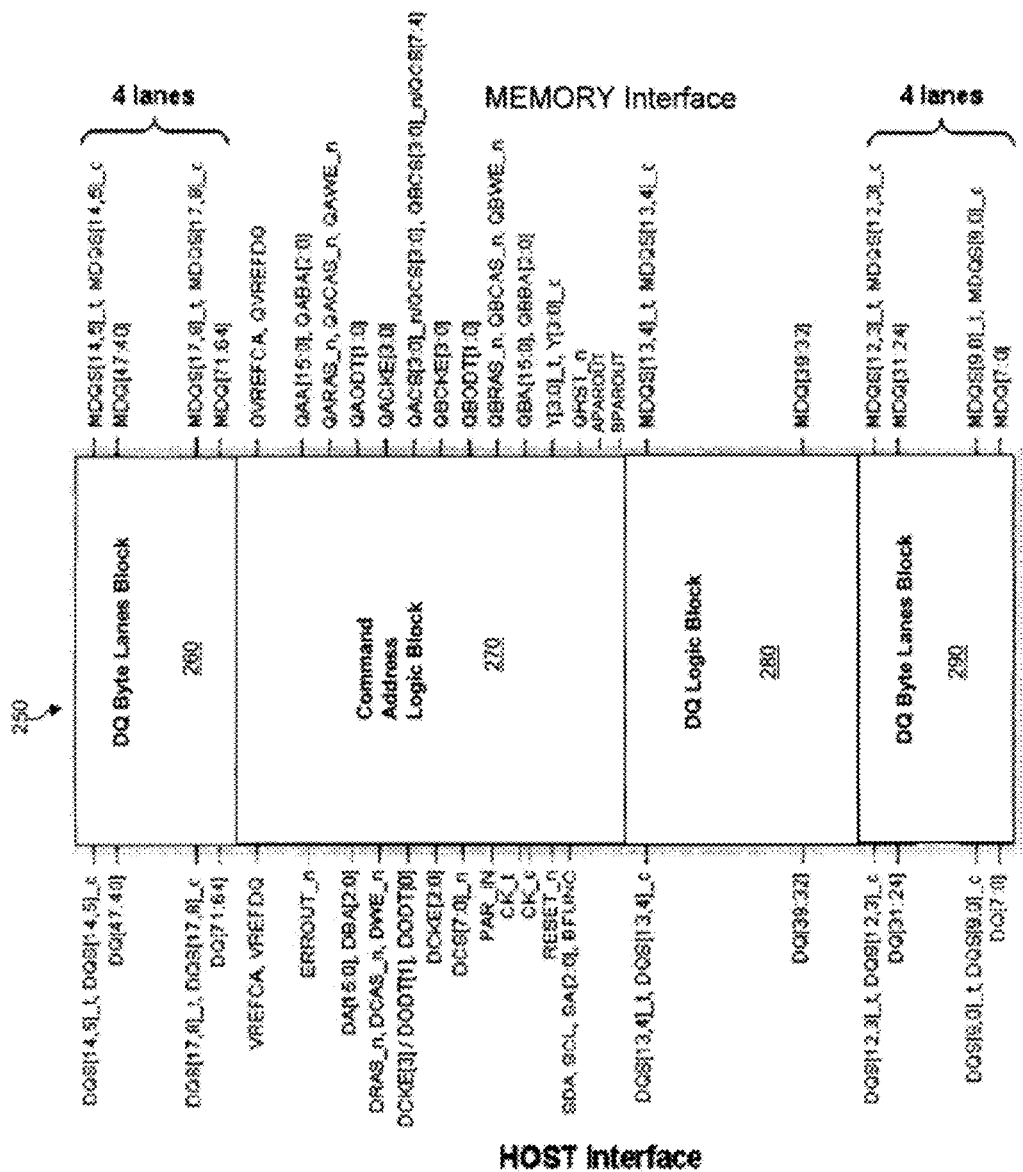
FIG. 3 is a simplified block diagram of a memory buffer according to various aspects of the present disclosure.

FIG. 3 illustrates a simplified block diagram of a memory buffer 250 according to an embodiment of the present disclosure. The memory buffer 250 includes a DQ byte lanes block 260, a command address logic block 270, a DQ logic block 280, and a DQ byte lanes block 290. The DQ byte lanes block 260 contains DQ byte lanes 5-8, and the DQ byte lanes block 290 contains DQ byte lanes 0-3. The DQ byte lane 4 is included in the DQ logic block 280 in an embodiment, but may be included in the DQ byte lanes block 290 in alternative embodiments. Each of these blocks 250-290 may contain components such as digital circuitries or digital devices, for example, flip-flops, registers, and/or state machines. These digital components may be implemented using transistor devices, such as metal-oxide semiconductor field effect transistor (MOSFET) devices.

The memory buffer 250 has a host interface and a memory interface. The host interface is the interface with an upstream device. As an example, the upstream device may be a CPU, or more specifically, a memory controller agent on a Double Data Rate (DDR) channel of the CPU. The memory interface is the interface with a downstream device. As an example, the downstream device may be a memory device, such as a DIMM memory device. The host interface and the memory interface may also be referred to as input and output interfaces of the memory buffer 250, respectively. A plurality of signals, including data signals and control signals, come in and out of the host and memory interfaces to and from their respective blocks, as is shown in FIG. 3. For the sake of simplicity, these signals are not described in detail herein.

The memory buffer 250 may be similar to a conventional JEDEC memory buffer in some aspects. However, the memory buffer 250 offers numerous additional functionalities and improvements over the conventional JEDEC memory buffer such as, for example, the additional functionalities shown in Table 1 above. A number of these additional functionalities and improvements are associated with the implementation of the command address logic block 270. The following discussions of the present disclosure focus on the implementation of the command address logic block 270 and its associated improvements over conventional JEDEC memory buffers.

Figure 4:
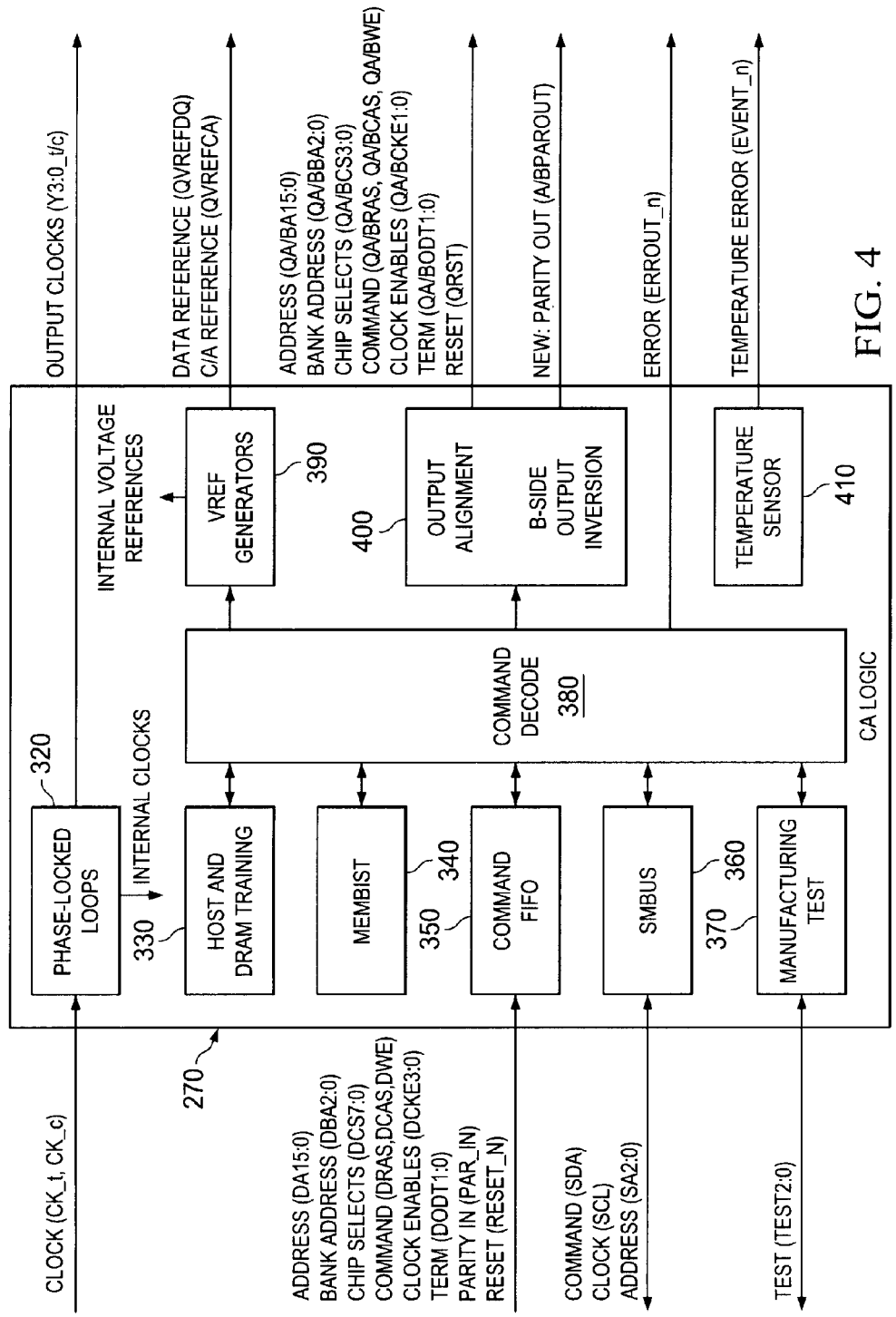
FIG. 4 is a simplified block diagram of a command address logic block of the memory buffer of FIG. 3 according to various aspects of the present disclosure.

FIG. 4 illustrates a simplified block diagram of the command address logic block 270 of the memory buffer 250 of FIG. 3 according to an embodiment of the present disclosure. The command address logic block 270 includes a phase-locked loops block 320, a host and DRAM training block 330, a memory built-in self-test (MemBIST) block 340, a command first-in-first-out (FIFO) block 350, a system management bus (SMBus) block 360, a manufacturing test block 370, a command decode block 380, a voltage-reference (Vref) generators block 390, an output alignment block 400, and a temperature sensor block 410. Each of these blocks 320-410 may contain appropriate digital circuitries to carry out their intended functionalities. A plurality of digital signals come into and out of some of these blocks, as shown in FIG. 4. It is noted that this embodiment shown in FIG. 4 offers at least two new parity out signals APAROUT and BPAROUT that do not otherwise exist in a conventional JEDEC memory buffer.

One of the functions of the command address logic block 270 is that it can perform arbitrary mapping between input signals and output signals of the memory buffer. The arbitrary mapping between input/output signals may depend on an optimization priority, which may include optimization for performance, optimization for power consumption, optimization for availability and service, and/or other suitable optimization objectives. This is shown in FIG. 5, which is a flowchart illustrating a method 450 of carrying out the arbitrary mapping between input/output signals based on desired optimization priorities.

The method 450 begins with block 460 in which an IHS system is powered on. The method 450 continues with block 470 in which DIMM serial-presence-detect (SPD) electrically-erasable programmable read-only memories (EEPROMs) are read to determine installed memory (e.g., DIMM) types. The method 450 continues with block 480 in which the system profile settings are checked for Power/Performance/Reliability-Availability-Serviceability (RAS) optimization performance. Based on the results of the block 480, the method 450 then proceeds to a decision block 490 to determine if the memory performance should be optimized. If the answer returned by the decision block 490 is yes, then the method 450 proceeds to block 500 in which the command signals Chip-Select (CS), Clock-Enable (CKE), and On-Die-Termination (ODT) are remapped for the highest rank and interleaved across physical DIMMs behind each memory buffer.

If the answer returned by the decision block 490 is no, then the method 450 proceeds to a decision block 510 to determine if the power consumption should be optimized. If the answer returned by the decision block 510 is yes, then the method 450 proceeds to block 520 in which the signals CS, CKE, and ODT are remapped to support maximum CKE power down and self-refresh granularity across physical DIMMs behind each memory buffer. If the answer returned by the decision block 510 is no, then the method 450 proceeds to a decision block 530 to determine if reliability, availability, and/or serviceability should be optimized. If the answer returned by the decision block 530 is yes, then the method 450 proceeds to block 540 in which the signals CS, CKE, and ODT are remapped to keep consecutive ranks on the same physical DIMMs behind each memory buffer. If the answer returned by the decision block 530 is no, then the method 450 proceeds to a decision block 550 to determine what other optimizations should be done, and thereafter proceeds to block 560 to remap CS, CKE, and ODT accordingly. Regardless of the optimization schemes, the method 450 resumes with block 570 to continue the rest of the memory initialization.

Figure 5:
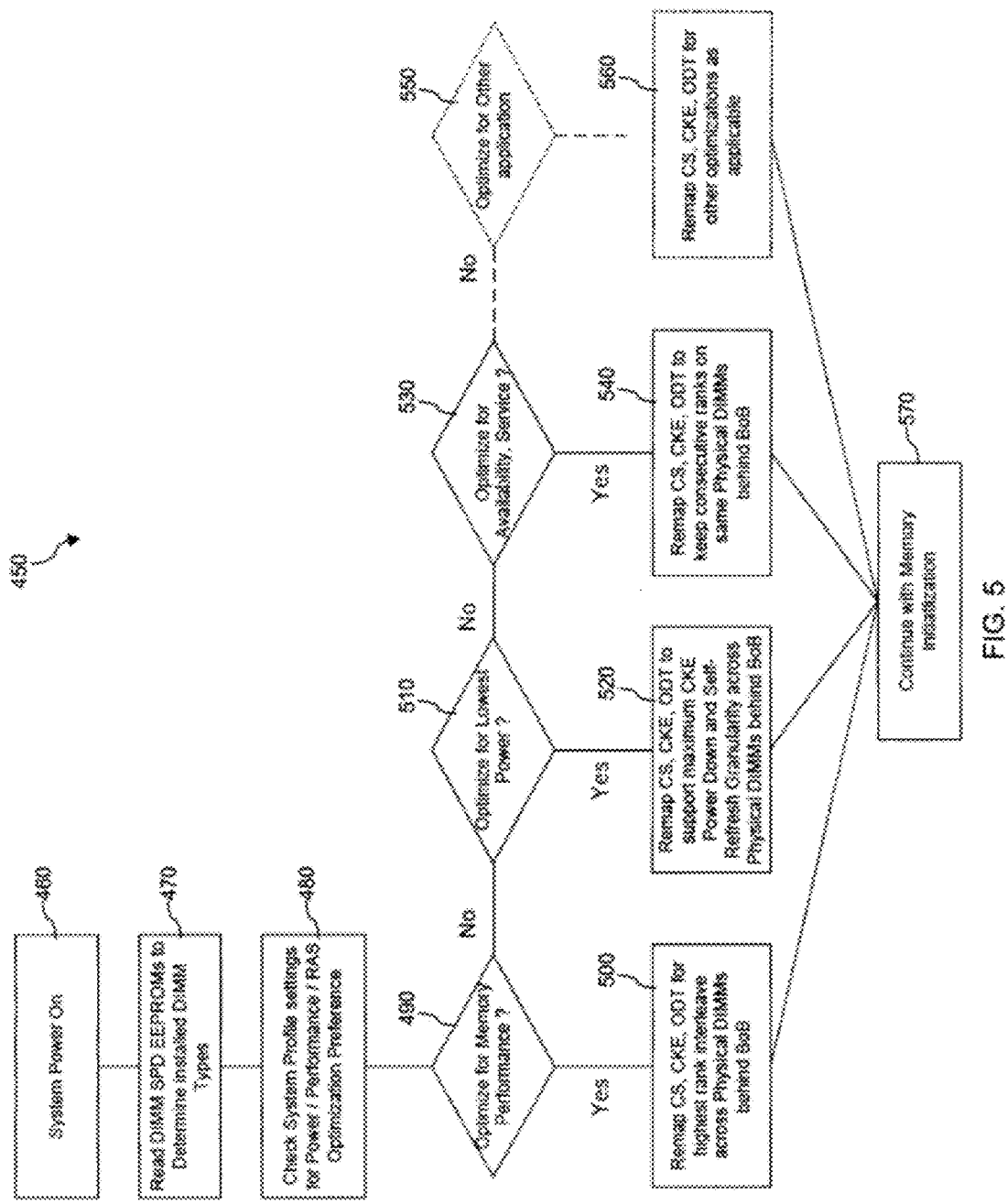
FIG. 5 is a flowchart illustrating a method of carrying out an arbitrary mapping scheme between input/output signals based on a desired optimization priority.

It is understood that in some embodiments, the decision blocks 490, 510, and 530 do not necessarily need to be executed sequentially in the order shown in FIG. 5. Rather, any other alternative order sequence may be used. The blocks 490, 510, and 530 may also be executed in a parallel manner, such that the execution of any one of these blocks does not depend on the results of the other of the blocks. It is also understood that the method 450 may be implemented by state machines in one embodiment, or by software, firmware, and/or state machines in other embodiments. This is also true for the methods shown in subsequent flowcharts of the later figures.

Figure 6:
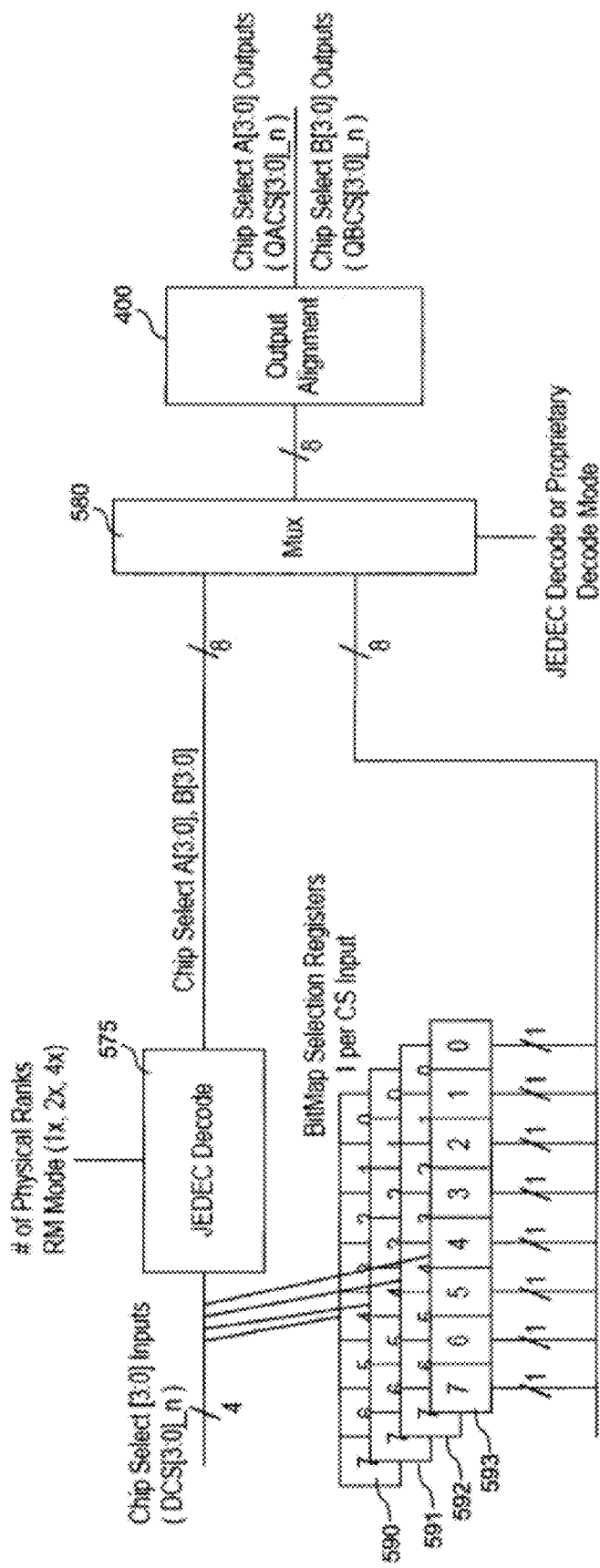
FIGS. 6-8 illustrate simplified block diagrams of circuitries used to arbitrarily map various command signals from the input of the memory buffer to the output of the memory buffer.
Figure 7:
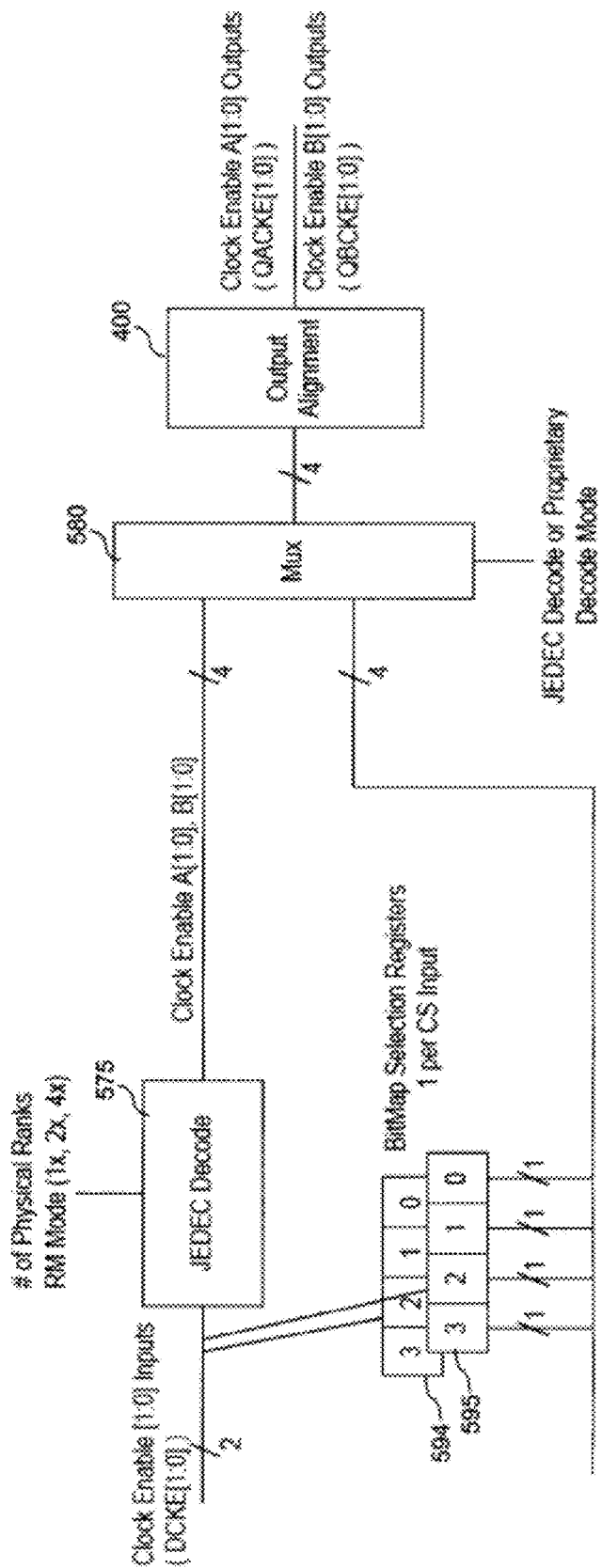
Figure 8:
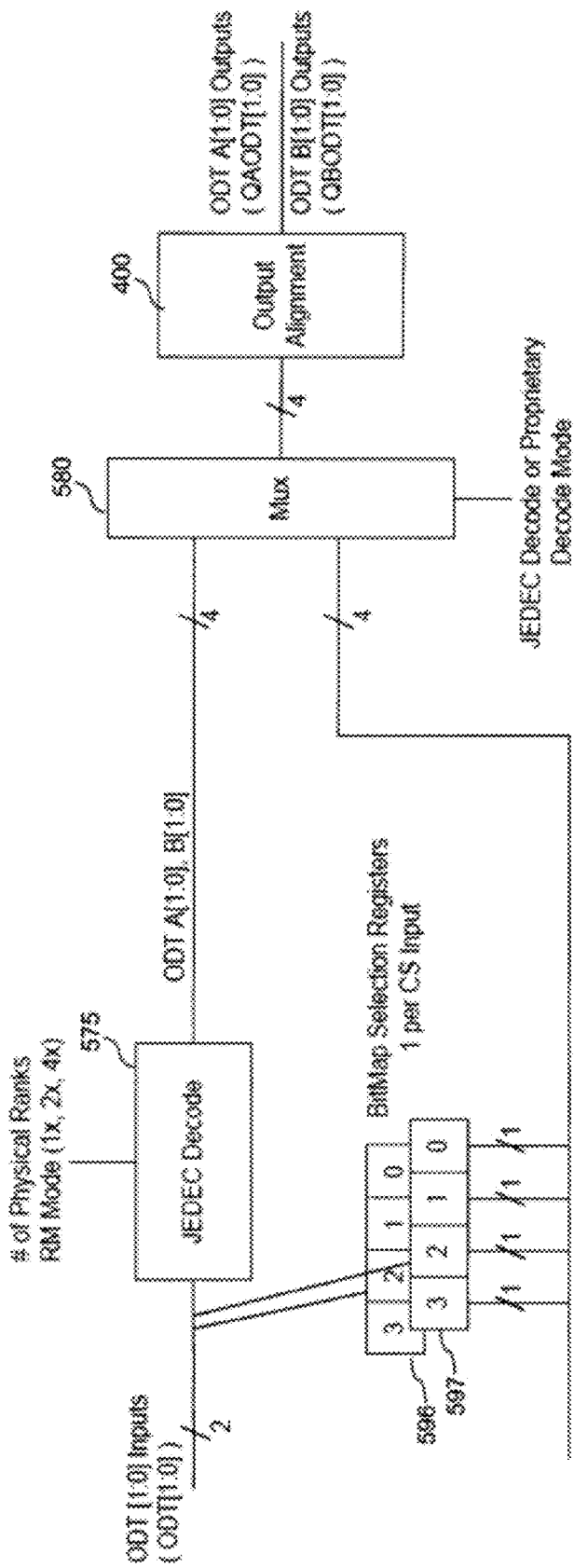

FIGS. 6-8 illustrate simplified block diagrams of circuitries used to arbitrarily map the command signals CS, CKE, and ODT, respectively, from the input of the memory buffer to the output of the memory buffer. Once again, arbitrary mapping is done so that the memory buffer may be optimized according to different optimization priorities as shown in FIG. 5. Conventional JEDEC memory buffers have a rigid and inflexible mapping scheme for these command signals, which is listed in Table 2 below.

Taking the top row as an example, it indicates that in the normal mode of operation (no rank multiplication, so there is only one rank), if the input command signal DCS[0]_n (bit 0) from the host is asserted, then two output command signals QACS[0]_n and QBCS[0]_n are asserted. Note that the "_n" merely indicates that the signal is an active-low signal, meaning it is asserted with a logical low. Active-high signals may be used in other embodiments. For the sake of simplicity, references to these signals in the discussions that follow may omit the "_n".

Among some of the limitations of the conventional JEDEC command signal mapping scheme, one limitation is that it may encounter difficulties in trying to support two single rank DIMMs simultaneously. For example, it may not be able to cover all possible cases of one or two SR or DR or QR cases simultaneously. Table 3 listed below is one potential application of using the signal mapping information contained in Table 2 to implement two general purpose DIMM slots behind the buffer. Although the mapping scheme shown in Table 3 is among the most flexible mappings available with

TABLE 2

| Description | # Physical Ranks | DIMM Physical Rank # | Host DCS[ ]_n | Buffer LogicalQCS Assertion | Buffer QACS[ ]_n | Buffer QBCS[ ]_n | Host CKE F[0]RC6[DA4, DA3] = 00 or 10 | Host CKE F[0]RC6 [DA4, DA3] = 01 | Buffer QACKE assertion | Buffer QBCKE assertion |
|---|---|---|---|---|---|---|---|---|---|---|
| Normal Mode (No Rank Multi-plication) | 1 | 0 | DCS[0]_n | QCS0 | QACS[0]_n | QBCS[0]_n | DCKE[0] | DCKE[0] | QACKE[0] | QBCKE[0] |
| | 2 | 0 | DCS[0]_n | QCS0 | QACS[0]_n | QBCS[0]_n | DCKE[0] | DCKE[0] | QACKE[0] | QBCKE[0] |
| | | 1 (m) | DCS[1]_n | QCS1 | QACS[1]_n | QBCS[1]_n | DCKE[1] | DCKE[1] | QACKE[1] | QBCKE[1] |
| | 4 | 0 | DCS[0]_n | QCS0 | QACS[0]_n | QBCS[0]_n | DCKE[0] | DCKE[0] | QACKE[0] | QBCKE[0] |
| | | 1 (m) | DCS[1]_n | QCS1 | QACS[1]_n | QBCS[1]_n | DCKE[1] | DCKE[1] | QACKE[1] | QBCKE[1] |
| | | 2 | DCS[2]_n | QCS2 | QACS[2]_n | QBCS[2]_n | DCKE[0] | DCKE[2] | QACKE[2] | QBCKE[2] |
| | | 3 (m) | DCS[3]_n | QCS3 | QACS[3]_n | QBCS[3]_n | DCKE[1] | DCKE[3] | QACKE[3] | QBCKE[3] |
| 2 Way Rank Multi-plication | 4 | 0 | DCS[0]_n | QCS0 | QACS[0]_n | QBCS[0]_n | DCKE[0] | DCKE[0] | QACKE[0] | QBCKE[0] |
| | | 2 | | QCS2 | QACS[2]_n | QBCS[2]_n | | DCKE[2] | QACKE[2] | QBCKE[2] |
| | | 1 (m) | DCS[1]_n | QCS1 | QACS[1]_n | QBCS[1]_n | DCKE[1] | DCKE[1] | QACKE[1] | QBCKE[1] |
| | | 3 (m) | | QCS3 | QACS[3]_n | QBCS[3]_n | | DCKE[3] | QACKE[3] | QBCKE[3] |
| | 8 | 0 | DCS[0]_n | QCS0 | QACS[0]_n | — | DCKE[0] | DCKE[0] | QACKE[0] | QBCKE[0] |
| | | 4 | | QCS4 | — | QBCS[0]_n | | | | |
| | | 1 (m) | DCS[1]_n | QCS1 | QACS[1]_n | — | DCKE[1] | DCKE[1] | QACKE[1] | QBCKE[1] |
| | | 5 (m) | | QCS5 | — | QBCS[1]_n | | | | |
| | | 2 | DCS[2]_n | QCS2 | QACS[2]_n | — | DCKE[0] | DCKE[2] | QACKE[2] | QBCKE[2] |
| | | 6 | | QCS6 | — | QBCS[2]_n | | | | |
| | | 3 (m) | DCS[3]_n | QCS3 | QACS[3]_n | — | DCKE[1] | DCKE[3] | QACKE[3] | QBCKE[3] |
| | | 7 (m) | | QCS7 | — | QBCS[3]_n | | | | |
| 4 Way Rank Multi-plication | 8 | 0 | DCS[0]_n | QCS0 | QACS[0]_n | — | | DCKE[0] | QACKE[0] | QBCKE[0] |
| | | 2 | | QCS2 | QACS[2]_n | — | | DCKE[2] | QACKE[2] | QBCKE[2] |
| | | 4 | | QCS4 | — | QBCS[0]_n | | DCKE[0] | QACKE[0] | QBCKE[0] |
| | | 6 | | QCS6 | — | QBCS[2]_n | | DCKE[2] | QACKE[2] | QBCKE[2] |
| | | 1 (m) | DCS[1]_n | QCS1 | QACS[1]_n | — | DCKE[1] | DCKE[1] | QACKE[1] | QBCKE[1] |
| | | 3 (m) | | QCS3 | QACS[3]_n | — | | DCKE[3] | QACKE[3] | QBCKE[3] |
| | | 5 (m) | | QCS5 | — | QBCS[1]_n | | DCKE[1] | QACKE[1] | QBCKE[1] |
| | | 7 (m) | | QCS7 | — | QBCS[3]_n | | DCKE[3] | QACKE[3] | QBCKE[3] |

Table 2 is a decoding table. Each row of Table 2 corresponds to an input/output command signal mapping configuration.

respect to all the possible DIMM population cases, it still does not support SR/SR.

TABLE 3

| | Buffer Output CS Mapping | | 2 DCKE Mode Always at DIMM | Ideally need 4 separate ODTs | | | | | | |
|---|---|---|---|---|---|---|---|---|---|---|
| | DIMM1 CS3:0 | DIMM0 CS3:0 | DIMM CKE[1:0] | DIMM ODT[1:0] | None/SR | None/DR | None/QR | SR/SR | DR/DR | QR/QR |
| DIMM SLOT 0 | | QACS0/QCS0 | QACKE[0] | QAODT[0] | Yes DCS0 | Yes DCS1:0 | Yes DCS3:0 | No Can't | Yes for 4CS | Yes 8-rank |

TABLE 3-continued

| | Buffer Output CS Mapping | | 2 DCKE Mode Always at DIMM | Ideally need 4 separate ODTs | | | | | | |
|---|---|---|---|---|---|---|---|---|---|---|
| | DIMM1 CS3:0 | DIMM0 CS3:0 | DIMM CKE[1:0] | DIMM ODT[1:0] | None/SR | None/DR | None/QR | SR/SR | DR/DR | QR/QR |
| | | | | | DM to ACS0 DCKE0 to ACKE0 | DM to ACS1:0 DCKE1: 0 to ACKE1:0 | DM to ACS3:0 or DCS1:0 RM2 to ACS3:0 A16 on CS2 | assert ACS0 and ACS2 independently | Buffers DCS1:0 DM to ACS1:0. Yes for ALL Buffers DCS1:0 RM2 to ACS1:0 Ranks 0 and 1 Here | mode DCS1:0 RM4 to QCS7:0 A17:16 on DCS3:2 Ranks 0, 1, 6, 7 Here |
| DIMM SLOT 1 | QACS2/ QCS2 QACS3/ QCS3 | QACS1/QCS1 QBCS2/QCS6 QBCS3/QCS7 | QACKE[1] QACKE[2] but really QACKE[0] QACKE[3] but really QACKE[1] | QAODT[1] QBODT[0] QBODT[1] | | | | | Yes for 4CS Buffers DCS3:2 DM to ACS3:2. Yes for ALL Buffers DCS1:0 RM2 to SCS3:2 Ranks 2 and 3 here | Ranks 2, 3, 4, 5 Here |

As is shown in Table 3, if a single rank DIMM exists both in slot 0 and slot 1 (where each slot represents a different physical DIMM), then the conventional JEDEC mapping scheme does not allow the chip select DCS command signal to be mapped to both DIMM slots. In other words, although it is desirable to map the DCS signals to two different DIMM slots, the conventional JEDEC mapping scheme is capable of mapping the DCS signal to only one DIMM.

Table 3 is one of many possible applications of the CS, CKE, and ODT signal mappings from Table 2 to implement two DIMM slots behind the buffer. Careful examination of the fixed decoding of Table 2 will reveal that Table 3, and all other possible alternatives to Table 3, all fall short of being able to provide two general purpose DIMM slots, capable of supporting one or two single rank, dual rank, or quad rank DIMMs. For instance, if a mapping is used to support two single rank DIMMs, it is not be possible to also support two dual rank DIMMs and two quad rank DIMMs.

The memory buffer of the present disclosure overcomes this problem. Referring to FIGS. 4 and 6, the command decode block 380 (shown in FIG. 4) contains (among other things) a JEDEC decode block 575 (shown in FIG. 6), a multiplexer 580 (MUX), and a plurality of BitMap selection registers 590, 591, 592, and 593. The JEDEC decode block 575 contains circuitries such as state machines and other suitable digital logic that can be used to implement the conventional JEDEC command signal decoding scheme illustrated in Table 2 above. As shown in FIG. 6, the JEDEC decode block 575 outputs signals chip select QACS[3:0] and QBCS[3:0], which when combined comprises eight bits.

Each bit of the chip select DCS signal is coupled to a respective one of the BitMap selection registers 590-593. Each of the BitMap selection registers 590-593 has eight separate bit fields. The bit fields may each be programmable. Each of the bit fields can output a 0 or a 1. The corresponding bit fields from each of the BitMap selection registers are coupled together in a logical OR manner in an embodiment. In other words, the bit field 1 for all four of the BitMap selection registers are logically OR-ed together, the bit field 2 for all four of the BitMap selection registers are logically OR-ed together, so on and so forth. Since the memory buffer disclosed herein follows an active-low scheme, a logical low (zero) corresponds to an assertion. Thus, the logical OR-ing of the bit fields from the BitMap registers 590-593 means that when one bit field is de-asserted (logical high), then the combined output of the four bit fields from all the registers 590-593 is also de-asserted.

Each of the BitMap selection registers 590-593 is coupled to a respective bit of the chip select command signal DCS[3:0]_n. Each bit of the signal DCS[3:0]_n serves as an enable input to its corresponding BitMap selection register. For example, the BitMap selection register 590 is enabled by bit 3 of the chip-select signal DCS[3:0] when bit 3 is asserted, the BitMap selection register 591 is enabled by bit 2 of the chip-select signal when bit 2 is asserted, etc.

The BitMap selection registers 590-593 output eight bits, which go into the multiplexer 580. The multiplexer 580 also accepts inputs from the output of the JEDEC decode block 575, which are the chip-select signals QACS[3:0] and QBCS[3:0]. The multiplexer 580 can be switched in one of two modes by a control signal, which corresponds to two operation modes: the conventional JEDEC decode mode or the proprietary decode mode. In the conventional JEDEC decode mode, the multiplexer 580 routes the output from the JEDEC decode block 575 to the output alignment block 400 (shown in FIG. 4). In other words, the conventional JEDEC decode mode is akin to a standard JEDEC decoding operation.

In the improved decode mode of the present disclosure (also referred to as a proprietary decode mode), the multiplexer 580 will route the outputs from the BitMap selection registers 590-593 to the output alignment block 400. The values of the BitMap selection registers can be arbitrarily programmed depending on the configuration and the needs of the downstream memory devices. In an embodiment, the BitMap selection registers are arbitrarily programmed based on one of the optimization priorities discussed above in FIG. 5, for example optimization for memory performance, optimization for power consumption, and optimization for reliability/availability/serviceability. Each optimization priority may require a different configuration for the downstream memory device and as such may require the BitMap selection registers to generate different bit patterns as their output. The BitMap selection registers are programmed in a manner so that their output basically simulate or masquerade as the chip-select signals QACS[3:0] and QBCS[3:0] outputted from the JEDEC decode block 575. As an example, if it is desired that the combined output of chip-select signals QACS [3:0] and QBCS[3:0] should be 00110011 to accomplish the desired mapping scheme, then the BitMap selection registers can output 00110011 to the multiplexer 580. In this manner, the input chip-select signal DCS[3:0] (which is four bits) will get mapped to arbitrarily-determined output chip-select signals QACS[3:0] and QBCS[3:0]. This is done through the BitMap selection registers 590-593 and the multiplexer 580.

The output alignment block 400 contains circuitries that can either speed up or delay the output chip-select signals QACS[3:0] and QBCS[3:0] so that they can be captured at the correct designations properly. Stated differently, the output alignment block 400 can be used to accurately align the timing of the output chip-select signals.

FIGS. 7 and 8 are similar to FIG. 6, except that FIG. 7 shows how to carry out arbitrary mapping for the clock-enable command signal DCKE[1:0], and FIG. 8 shows how to carry out arbitrary mapping for the on-die termination command signal ODT[1:0]. The JEDEC decode block 575, the multiplexer 580, and the output alignment block 400 are still used in FIGS. 7 and 8. BitMap selection registers 594-595 are used in FIG. 7, and BitMap selection registers 596-597 are used in FIG. 8. In the manner similar to those discussed above with reference to FIG. 6, the input clock-enable signal DCKE [1:0] can be arbitrarily mapped to output clock-enable signals QACKE[1:0] and QBCKE[1:0], and the on-die termination signal ODT[1:0] can be arbitrarily mapped to output on-die termination signals QAODT[1:0] and QBODT[1:0].

This arbitrary command signal mapping ability of the memory buffer of the present disclosure offers several benefits. One benefit is that the memory buffer can handle two or more downstream DIMM memory devices simultaneously. Thus, the shortcoming of the conventional memory buffer associated with its inability to handle two single rank DIMMs (discussed above and shown in Table 3) would not exist for the memory buffer of the present disclosure.

In addition, the memory buffer disclosed herein also offers benefits in terms of power, latency, and error management. In more detail, refer to the last column of Table 3 above, the conventional JEDEC decoding scheme makes it such that ranks 0, 1, 6, 7 are in DIMM slot 0, and ranks 2, 3, 4, 5 are in DIMM slot 1. This type of rank splitting is undesirable, because it increases power consumption, increases latency, and results in poor error management. In comparison, using the decoding scheme discussed above, the memory buffer disclosed herein allows ranks 0-3 to be in DIMM slot 0, and ranks 4-7 to be in DIMM slot 1. As such, power consumption and latency will be reduced, and error management can be improved. Accordingly, by being able to arbitrarily map the command signals from the input of the memory buffer to the output, different optimization objectives can be achieved, such as optimization for performance, power, reliability/availability/service, etc, as shown in the flowchart in FIG. 5 above.

Furthermore, the memory buffer disclosed herein offers fully flexible decoding of the BitMap selection registers to allow fully arbitrary assertion of the eight QACS[3:0] and QBCS[3:0] output signals based on the four DCS[3:0] inputs. This allows decoding to a single CS output, mirrored A/B CS outputs which can be advantageously used to improve signal integrity, or multiple outputs for use in "broadcast" writes. Broadcast writes may be used to speed up DRAM or DIMM initialization, DDR channel training, provide diagnostic capability, and support memory mirroring operations where data is intentionally written to a pair of ranks to improve system availability in case of a memory error.

Figure 9:
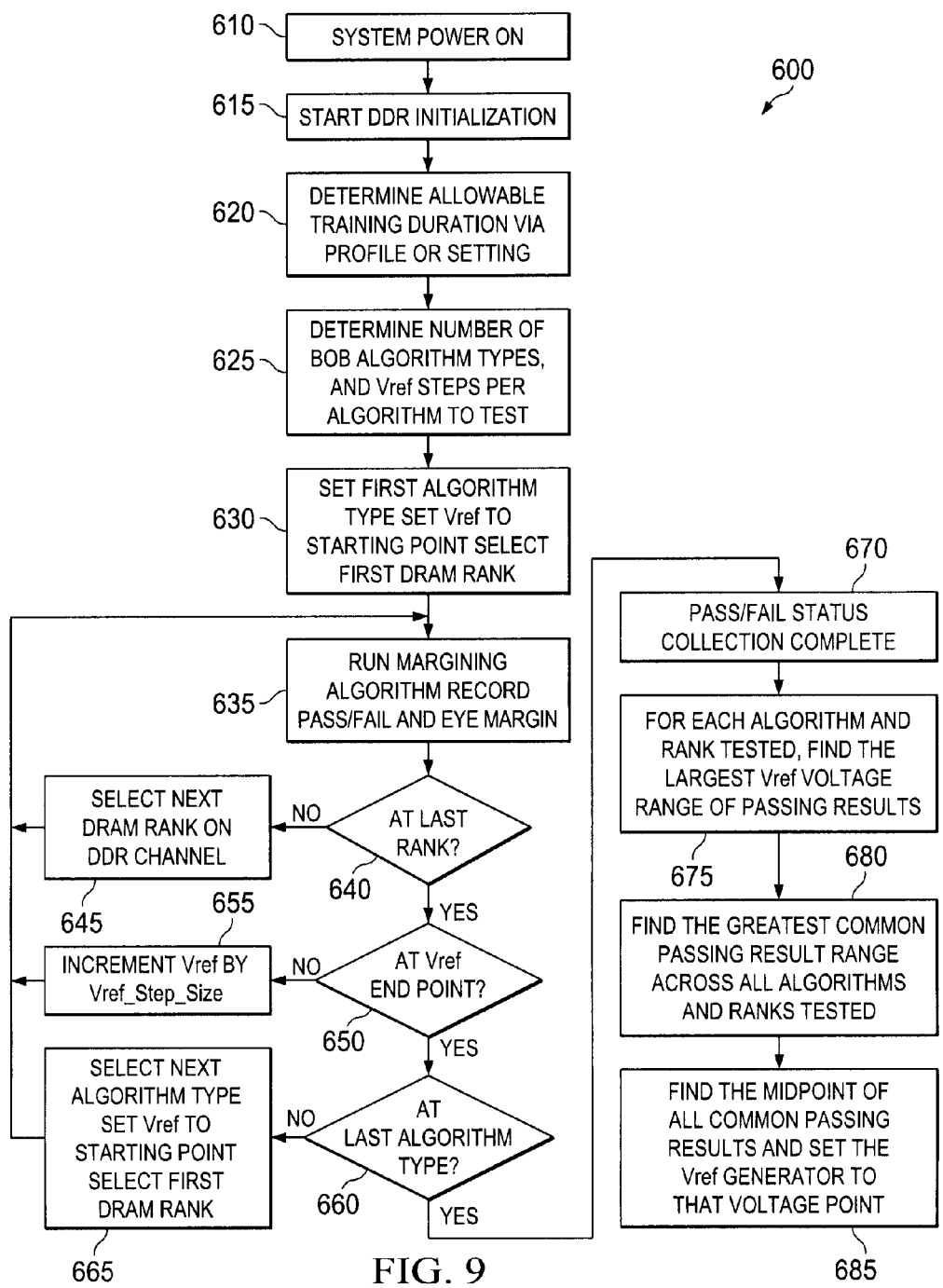
FIG. 9 is a flowchart of a voltage reference training method that can be used to determine optimal voltage reference levels according to various aspects of the present disclosure.

FIG. 9 is a flowchart of a voltage reference training method 600 that can be used to carry out two of the added functionalities of Table 1, specifically, the functionalities "programmable Vref outputs and internal Vref generators" and "incorporate Vref margining into DRAM side training algorithm" under the category "improved performance." A conventional JEDEC memory buffer typically has two voltage reference inputs: VrefCA (voltage reference for command address) and VrefDQ (voltage reference for data). Generally, a voltage reference signal is used to determine whether an input signal carries a 0 or a 1. In an embodiment, a voltage reference signal is set to the middle of an input range of an input signal. The input signal and the voltage reference signal may be both routed to a comparator. If the input signal is greater than the voltage reference signal, then it is determined that the input signal carries a 1; if the input signal is less than the voltage reference signal, then it is determined that the input signal carries a 0. As an example, a standard DDR3 signal switches between about 0 volt and about 1.5 volts, and therefore the voltage reference signal is set to about 0.75 volts. If the comparator indicates that the input DDR3 signal is greater than the voltage reference, then the input DDR3 signal carries a 1, otherwise it carries a 0. For the memory buffer disclosed herein, VrefCA is the voltage reference signal for the command address signals for a downstream memory device, and VrefDQ is the voltage reference signal for the data signals for the downstream memory device.

One problem with conventional JEDEC memory buffers is that these voltage reference signals are somewhat fixed and are not dynamically adjustable. In more detail, the conventional JEDEC memory buffer may be capable of programmably setting a value for the voltage reference signals during initialization. However, the value is determined at factory build time. Once the voltage reference signals are set, they cannot be changed. This means that these fixed values of the voltage reference signals may not have the optimum values for different types of downstream memory devices, as each type of downstream memory device (depending on the manufacturer) may require a different voltage reference value. For example, a first type of downstream memory device may need to have a voltage reference value that is at X volts, and the second type of downstream memory device (possibly made by a different manufacturer) may need to have a voltage reference value that is at Y volts, where X and Y are at different values.

Due to the lack of voltage reference adjustment capabilities, the conventional JEDEC memory buffer cannot accommodate both of these downstream memory devices optimally. In other words, the voltage reference values set by the conventional JEDEC memory buffer may at best be suitable for one of these memory devices, but not both. Failure could occur if two types of memory devices (or even the same type of memory device from different manufacturers) were to be implemented behind the memory buffer. This is one of the reasons why a conventional JEDEC memory buffers cannot handle multiple types of downstream memory devices. As such, conventional JEDEC memory buffers typically works with a single type of downstream memory device from a given manufacturer and sets a voltage reference value that is suitable for that memory device only.

In comparison, the memory buffer disclosed herein is designed to work with multiple types of downstream memory devices. To accomplish this, the memory buffer can dynamically adjust the voltage reference values in small incremental steps for each Vref testing algorithm or pattern and for each downstream memory device. In case there are different types of downstream memory devices that have different optimum voltage reference values, the memory buffer disclosed herein can set its voltage reference signals to have the greatest operating margin that works with different downstream devices.

As an example, the voltage reference value may be set to an arbitrary low value initially, for example 0.6 volts. It is anticipated that this low voltage reference value will likely cause failure because it is too low. Then the voltage reference value is incremented in small steps, for example in 0.01 volt steps, and it is observed at what level failure will no longer occur. For example, at 0.65 volts, failure no longer occurs. This value is recorded as a lower limit of an operating range for voltage reference signal. The voltage reference value continues to be incremented until failure occurs once again because the voltage reference value is now too high, for example this value may be at 0.91 volts. This value is recorded as the upper limit of an operating range for the voltage reference signal. The lower limit (0.65 volts in this example) and the upper limit (0.91 volts in this example) are summed and averaged together to obtain a voltage reference value of 0.78 volts, which is the optimum voltage reference value that allows for the greatest operating margin, meaning that the voltage reference signal has the greatest room to swing before it results in failure. It is understood that an optimum voltage reference signal can be derived for both the command address voltage reference signal VrefCA and the data voltage reference signal VrefDQ. It is also understood that the voltage reference value may be either incremented (starting from a low value and ending with a high value), or decremented (starting from a high value and ending with a low value). An alternative way of expressing the idea of decrementing the voltage reference value is that the voltage reference values are incremented by a negative value, rather than a positive value. Therefore, "incrementing" herein may mean adjusting a value in a constantly upward fashion or may mean adjusting a value in a constantly downward fashion.

The discussions above pertains to a simplified example of Vref training. A more detailed example is discussed below with reference to FIG. 9. The method 600 in FIG. 9 illustrates an embodiment of voltage reference signal setting in accordance with the discussions above. The method 600 begins with block 610 in which an IHS system is powered on. The method 600 continues with block 615 in which DDR initialization is started. The method 600 continues with block 620 in which an allowable Vref training duration is determined via profiles or settings. The profiles or settings may relate to what type of optimization scheme is desired, for example optimization for performance, or power, or reliability/availability/serviceability, as discussed above with reference to FIG. 5. The Vref training duration refers to an amount of time that is allotted to conducting Vref training, for example a number of milliseconds. The method 600 continues with block 625 in which the number of memory buffer testing algorithm types and the number of Vref steps per algorithm to test are determined.

The method 600 continues with block 630 in which a first algorithm type is set, and Vref is set to the starting point. For example, as discussed above, this starting point may be an arbitrary low Vref voltage that will result in a failure. A first DRAM rank to be tested is also selected. The method 600 continues with block 635 in which the first test algorithm is run on the first selected DRAM rank and see if failure occurs. The method 600 then continues with a decision block 640 to determine if the last rank has been reached. If the answer is no, then that indicates not every rank has been tested, and thus the method 600 proceeds to block 645 in which the next DRAM rank is selected on the DDR channel, and then the block 635 is executed again, meaning the first testing algorithm is executed on the next rank. This process repeats until the answer returned by the decision block 640 is yes, meaning each rank has been tested with the first testing algorithm. In this manner, the blocks 635, 640, and 645 form a loop to test all the ranks of a memory device under a specific Vref test voltage.

When each rank has been tested using the loop discussed above, the method 600 proceeds to another decision block 650 to determine if the Vref end point has been reached. If the answer is no, then the method 600 proceeds to block 655 in which the Vref voltage is incremented by Vref_Step_Size. Vref_Step_Size may be a small value and may be a constant, for example 0.01 volts, or another suitable value. The method 600 then goes back and executes block 635 again. This process continues until the answer from the decision block 650 indicates that the entire Vref range has been tested. It is anticipated that at the lower end and the higher end of the voltage ranges, failure will most likely occur, but the voltages near the middle of the range should pass. In this manner, the blocks 635, 650, and 655 form another loop to test the entire range of Vref values. Note that since this loop contains the loop to test all the memory ranks, a nested loop situation is created. In each run of the loop to test a particular Vref voltage, the entire inner loop of testing all the memory ranks is executed again.

When the nested loop described above has finished execution completely, the decision block 650 returns a "yes" answer, and the method 600 proceeds to block 460 to determine if the last testing algorithm has been reached. If the answer is no, then the method 600 proceeds to block 665 in which the next Vref testing algorithm is selected. At this point, the Vref testing voltage is reset to the lower limit value, and the DRAM rank is also reset to the first rank. The method 600 then goes back and executes block 635 again. This process continues until the answer from the decision block 660 indicates that all the Vref testing algorithms have been executed. In this manner, the blocks 635, 660, and 665 form another loop to test the entire collection of Vref testing algorithms. Note that this loop contains the nested loop to test all the memory ranks and all the Vref testing voltages as discussed above. Consequently, an additional nested loop is created. This nested loop (for executing all the Vref training algorithms) contains another nested loop therein (for executing all the Vref testing voltages), which contains another loop therein (for testing all the DRAM ranks). As an example, if there are a total of 4 ranks to be tested, a total of 20 different Vref testing voltages (incremented by 0.01 volts), and a total of 5 Vref testing algorithms, then the Vref testing is executed 4×20×5=400 times. Each time, a pass/fail result is recorded.

It is understood that these numbers of DRAM ranks, Vref testing voltages, and Vref testing algorithms are merely examples, and that other numbers may be used instead. Also, this nested loop described above and shown in FIG. 9 need not be limited in any specific nesting configuration. As examples, the loop for testing the range of Vref voltages may be the innermost loop, or the loop for executing all the Vref testing algorithms may be the innermost loop. Each of the loops discussed above may be nested in a suitable manner according to the needs associated with their respective embodiments.

The method 600 continues with block 670 in which the pass/fail status collection is complete. The method 600 then continues with block 675 in which the largest Vref range of passing results is determined for each algorithm and rank combination. The method 600 then continues with block 680 in which the greatest common passing range is determined across all Vref testing algorithms and across all ranks. The method 600 then continues with block 685 in which the midpoint of all pass results is found and set as the Vref generator voltage.

The method 600 discussed above and shown in FIG. 9 is performed for a particular Vref voltage type (for example, either VrefDQ (data) or VrefCA (control address)), and for a particular memory device. Thus, the method may be repeated for the different types of Vref voltages and for different memory devices. In other words, at least two other additional nested loops may be created that contain the nested loops in the method 600.

Table 4 below is another way of illustrating the discussion above.

The first column "Test Pattern" contains different Vref testing patterns (or Vref testing algorithms) to be tested, which includes Vref testing patterns 1, 2, 3, and 4 in this example. The second column "DIMM#" contains different memory devices to be tested, which includes DIMM devices 1 and 2 in this example. The third column "Rank#" contains different DRAM ranks to be tested, which includes rank numbers 1 and 2 in this example. The remaining 21 columns are the different Vref testing voltages to be used for Vref training, which include voltage ranging from 0.065 V to 0.085 V in 0.01 steps. The pass/fails results are indicated with "F" for fail or "P" for pass. In this manner, Table 4 represents a nested loop containing four loops, with the stepping-through of all the Vref voltages as a first (innermost) loop, the stepping-through the different ranks as a second loop, the stepping-through the different DIMM devices as a third loop, and the stepping-through the different test patterns as the fourth (outermost) loop. After the entire nested loop has been executed, and the pass/fail result recorded for each iteration of the loop, all the cells of Table 4 are populated. Now, the best Vref voltage to accommodate all the test patterns, all the DIMM devices, and all the ranks for each DIMM device is selected, which is 0.073 V. This is because as illustrated in Table 4, when the Vref voltage is at 0.073 V, it has the "greatest room to swing" in both directions (left or right) before failure will occur. In this case, the passing margin is 0.02 volts. Also as discussed above, Table 4 above only illustrates a particular type of Vref voltage, and a Table similar to Table 4 may be created for another desired Vref voltage. In other embodiments, the dif-

TABLE 4

| | | | Vref Voltage set point and Pass/Fail Result | | | | | | | | | | |
|---|---|---|---|---|---|---|---|---|---|---|---|---|---|
| Test Pattern | DIMM # | Rank # | 0.065 | 0.066 | 0.067 | 0.068 | 0.069 | 0.07 | 0.071 | 0.072 | 0.073 | 0.074 | 0.075 |
| 1 | 1 | 1 | F | F | F | F | P | P | P | P | P | P | P |
| 1 | 1 | 2 | F | F | P | F | P | P | P | P | P | P | P |
| 1 | 2 | 1 | F | F | F | F | F | P | P | P | P | P | P |
| 1 | 2 | 2 | F | F | F | F | P | P | P | P | P | P | P |
| 2 | 1 | 1 | F | F | F | F | F | F | P | P | P | P | P |
| 2 | 1 | 2 | F | F | F | P | F | P | P | P | P | P | P |
| 2 | 2 | 1 | F | F | F | F | F | P | P | P | P | P | P |
| 2 | 2 | 2 | F | F | F | F | P | P | P | P | P | P | P |
| 3 | 1 | 1 | F | F | P | P | P | P | P | P | P | P | P |
| 3 | 1 | 2 | F | P | P | P | P | P | P | P | P | P | P |
| 3 | 2 | 1 | F | P | P | P | P | P | P | P | P | P | P |
| 3 | 2 | 2 | F | P | F | P | P | P | P | P | P | P | P |
| 4 | 1 | 1 | F | F | F | F | F | F | P | P | P | P | P |
| 4 | 1 | 2 | F | F | F | F | F | P | P | P | P | P | P |
| 4 | 2 | 1 | F | F | F | F | P | P | P | P | P | P | P |
| 4 | 2 | 2 | F | F | F | F | F | P | P | P | P | P | P |

| | | | Vref Voltage set point and Pass/Fail Result | | | | | | | | | | |
|---|---|---|---|---|---|---|---|---|---|---|---|---|---|
| Test Pattern | DIMM # | Rank # | 0.076 | 0.077 | 0.078 | 0.079 | 0.08 | 0.081 | 0.082 | 0.083 | 0.084 | 0.085 |
| 1 | 1 | 1 | P | P | P | F | F | F | F | F | F | F |
| 1 | 1 | 2 | P | P | P | P | P | F | F | F | F | F |
| 1 | 2 | 1 | P | P | P | P | P | P | P | F | F | F |
| 1 | 2 | 2 | P | P | P | P | P | P | P | F | F | F |
| 2 | 1 | 1 | P | P | P | P | P | F | F | F | F | F |
| 2 | 1 | 2 | P | P | P | P | P | P | P | F | P | F |
| 2 | 2 | 1 | P | P | P | F | F | F | F | F | F | F |
| 2 | 2 | 2 | P | P | P | P | P | P | F | F | F | F |
| 3 | 1 | 1 | P | P | F | F | F | F | F | F | F | F |
| 3 | 1 | 2 | P | P | F | F | F | F | F | F | F | F |
| 3 | 2 | 1 | P | P | F | F | F | F | F | F | F | F |
| 3 | 2 | 2 | F | F | F | F | F | F | F | F | F | F |
| 4 | 1 | 1 | P | P | P | P | P | P | F | F | F | F |
| 4 | 1 | 2 | P | P | P | P | P | F | F | F | F | F |
| 4 | 2 | 1 | P | P | P | P | F | F | F | F | F | F |
| 4 | 2 | 2 | P | F | F | F | F | F | F | F | F | F | ferent types of Vref voltages may be set to equal each other. In other words, the memory buffer may have common Vref outputs for VrefDQ and VrefCA, or may have individually programmable Vref outputs. Further, the memory buffer may have a single set of Vref outputs for all attached DIMMs, or may provide outputs for each DIIM individually.

The Vref training process discussed above may be carried out using the Vref generators block 390 in FIG. 4. The Vref generators block 390 may includes a combination of hardware, firm ware, and software that can be used together to carry out the Vref process discussed above. In one embodiment, the Vref generators block 390 generates the suitable QVREFDQ and QVREFCA signals that can be used for different downstream memory devices. In another embodiment, the Vref generators block 390 can generate separate sets of QVREFDQ and QVREFCA signals for each different downstream memory device. Without departing from the spirit and the scope of the present disclosure, the Vref generators block 390 can be implemented to handle variations in the number of Vref voltage steps, the number of Vref testing patterns, the number of downstream DIMMs, and the number of ranks. Further, the Vref generators block 390 can be implemented to take into consideration as to whether the Vref voltages are margined serially or in parallel, whether different types of testing patterns are used for the data Vref signal VS the command address Vref signal, whether a common set of Vref signals are used for both the data Vref signal and the command address Vref signal, or whether there is one common set of Vref signals for all downstream memory devices or separate Vref signals for each memory device. Regardless of the embodiment implemented, the Vref training process enables the Vref generators block 390 to work with different downstream memory devices simultaneously, which is advantageous over conventional JEDEC memory buffers.

The Vref training optimization process, described herein above, assumed that the DDR I/O voltage rail VDDQ was set to a fixed voltage (typically the nominal voltage), and that the clocks and strobes associated with capturing the input signals were previously properly optimized (centered). In practice, the optimal Vref settings are a function of the VDDQ rail setting and operational variation, as well as the clock and strobe position settings and operational variation.

Figure 10:
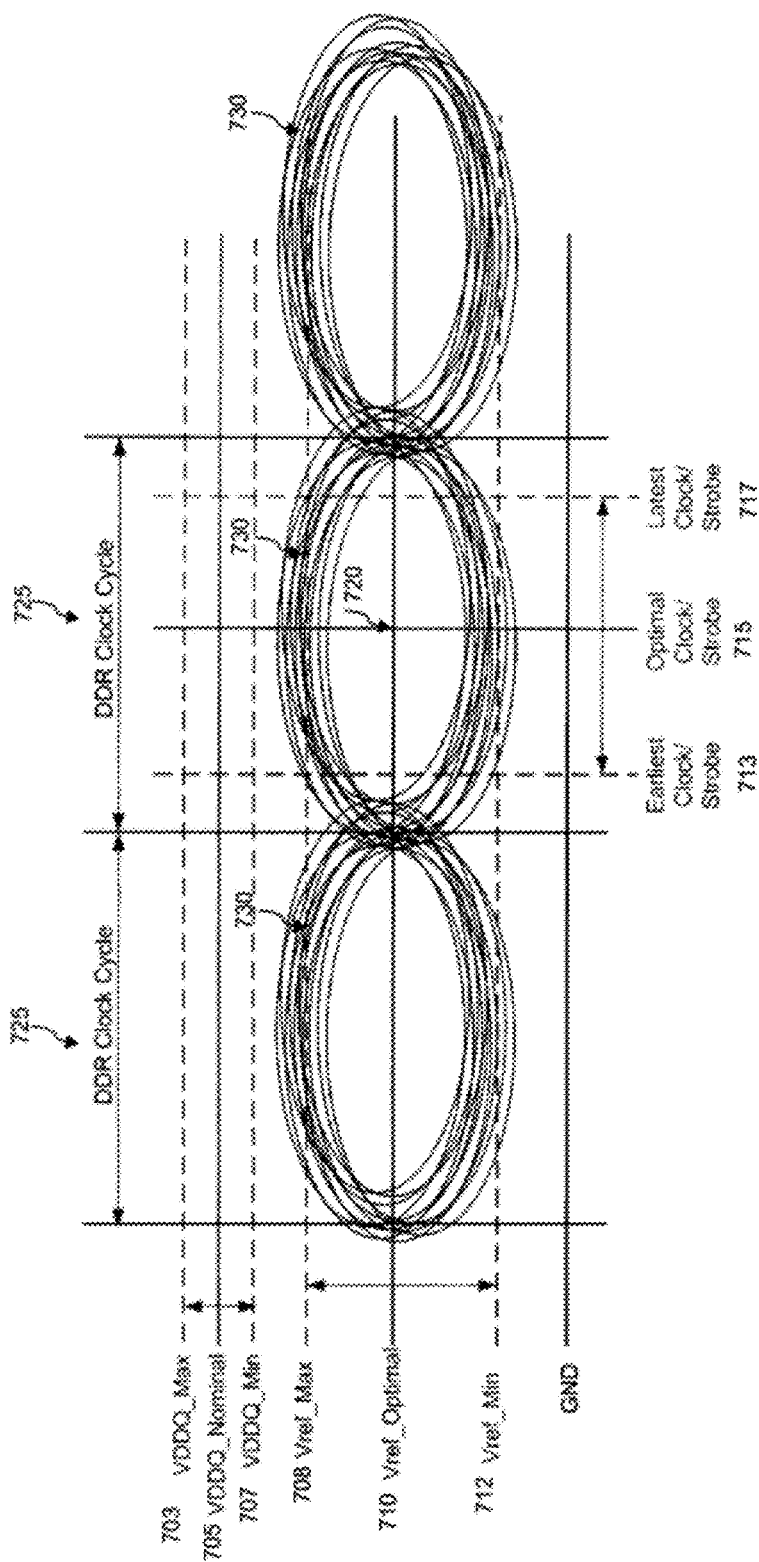
FIG. 10 is a diagram illustrating how input signal margins may be improved by determining optimal voltage reference levels and clock/strobe timings according to various aspects of the present disclosure.

FIG. 10 illustrates several "input signal eye diagrams" at an input receiver. One of the goals of Vref training and margining is to select the Vref voltage level that maximizes the high/low voltage margin, which corresponds to the horizontal center of the eye diagram. As can be seen, since the eye height will vary with the actual VDDQ voltage, and the eye width will vary with the clock/strobe position, additional steps may be taken to ensure that the Vref training results in an optimal operational setting.

The input signal forms an eye pattern 730 which varies with signal switching pattern, rate, and system noise. The eye pattern 730 is repeated in each DDR clock cycle 725. Within a DDR clock cycle 725, the clock/strobe may be positioned at an earliest possible position (Earliest_Clock/Strobe 713), a nominal position (Optimal_Clock/Strobe 715), and a latest possible position (Latest_Clock/Strobe 717). The DDR I/O Voltage may be supplied at a highest operating voltage (VDDQ_Max 703), a nominal operating voltage (VDDQ_Nominal 705), and a lowest operating voltage (VDDQ_Min 707). During Vref training, the Vref reference may be set to a minimum Vref voltage (Vref_Min 712), an optimal Vref voltage (Vref_Optimal 710), or a maximum Vref voltage (Vref_Max 708).

In an embodiment, after the VREFs are established per FIG. 9 method 600 and Table 4, the buffer will next margin test the VDDQ rail between VDDQ_Min 707 and VDDQ_Max 703 to ensure that all of the established VREFs are operable across all potential variation of the VDDQ rails. If the buffer has direct control of the memory VDDQ voltage regulator, it can adjust the VDDQ voltage setting directly. This could be through any industry standard interface such as parallel Voltage ID (VID), Serial Voltage ID (SVID), Power Management Bus (PMBus), SMBus, or any other suitable interface, or through a proprietary interface. If the buffer does not have direct control of the memory VDDQ voltage regulator, then the system BIOS, system management, or other system agent may be used to set the VDDQ voltage as required by the buffer. In this case the buffer would make a request to change the voltage to the system agent, the system agent would make the voltage change, and then the buffer would perform the margin test. This process would be repeated, looping through all other VDDQ voltage set points of interest. If any of the margin tests fail, VREF training may be restarted at a different VDDQ set point, or a more complex VREF training scheme may be used as described herein below. If all attempts to find an operable VREF set point fail, the buffer would provide error status back to the system.

In another embodiment, after the VREFs are established per FIG. 9 method 600 and Table 4, the buffer will next margin test the command/address clocks, and data strobes, between Earliest_Clock/Strobe 713 and Latest_Clock/Strobe 717 to ensure that the established VREFs are operable across all potential variation of clocks and strobes. Note that the buffer has full control of the positioning of the clocks and strobes on the memory interface per block 250 in FIG. 3. and block 270 in FIG. 4. If any of the margin tests fail, VREF training may be restarted at a different Clock/Strobe position, or a more complex VREF training scheme may be used as described herein below. If all attempts to find an operable VREF set point fail, the buffer would provide error status back to the system.

In another embodiment, the VDDQ rails and clock/strobes may be varied together during operable margin testing.

In another embodiment, the Vref training process may be further optimized, with all of the nested loops described in FIG. 9 method 600 forming an inner loop with VDDQ varied from VDDQ_Min to VDDQ_Max as an outer loop. Table 4 would be expanded and Pass/Fail status would be collected across Test Pattern, Rank, Vref, and VDDQ. In another embodiment, the Vref training process may be further optimized, with all of the nested loops described in FIG. 9 method 600 forming an inner loop with clocks and strobes varied from Earliest_Clock/Strobe to Latest_Clock/Strobe as an outer loop. Table 4 would be expanded and Pass/Fail status would be collected across Test Pattern, Rank, Vref, and Clock/Strobe position. In another embodiment, the Vref training process may be further optimized, with all of the nested loops described in FIG. 9 method 600 forming an inner loop with VDDQ varied from VDDQ_Min to VDDQ_Max and clocks and strobes varied from Earliest_Clock/Strobe to Latest_Clock/Strobe as outer loops. Table 4 would be expanded and Pass/Fail status would be collected across Test Pattern, Rank, Vref, VDDQ, and Clock/Strobe position. The order of the inner/outer loops is arbitrary. Note that this fully optimized training method does not require additional operable margin testing, as it already varies the VDDQ and clock/strobe positions as part of the method.

In another embodiment, multiple parameters Test Pattern, Rank, Vref, VDDQ, and Clock/Strobe position may be varied together in random, pseudo-random, or other pattern as necessary to perform the Vref optimization process to the accuracy desired within the time constraints desired.

Figure 11:
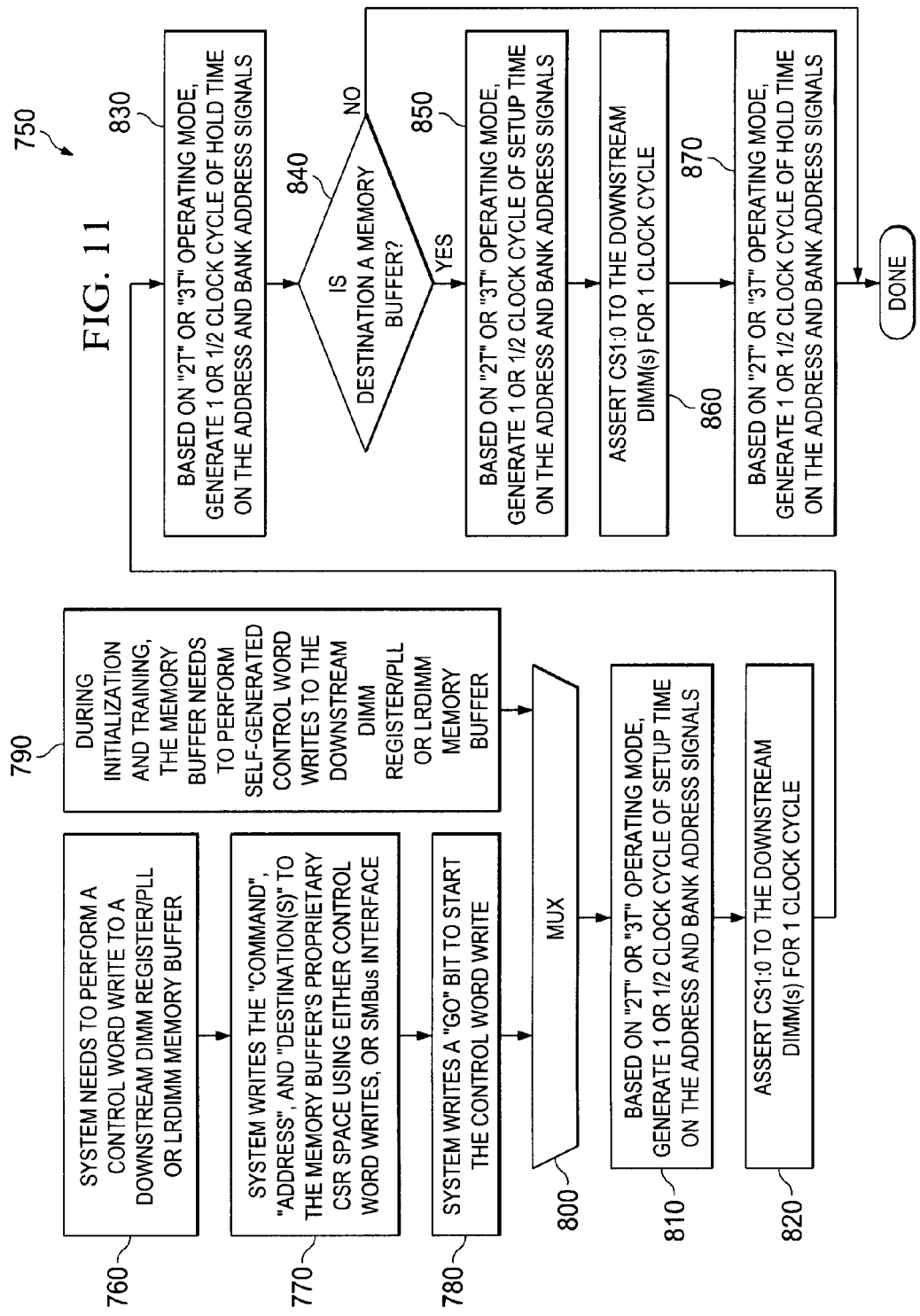
FIG. 11 is a flowchart of a method that can be used to "forward" control word writes through the memory buffer in a manner to accommodate cascaded memory buffers according to various aspects of the present disclosure.

FIG. 11 is a flowchart of a method 750 that can be used to carry out the added functionality "Control Word Writes with Arbitrary QCSA/B3:0 assertion" of Table 1. The JEDEC Control Word Writes mechanism is used to perform initialization writes entirely over the command/address signals (i.e. the data signals are not used). In this special mode, four address signals are used as data signals. Standard Data/ECC signals cannot be used since Register/PLL devices do not have data signal connectivity at all, the buffers that do have data connectivity cannot use the data bus until after it is trained, and there is no JEDEC standard initialization protocol support over the data signals. The conventional JEDEC memory buffer does not offer the capability to "forward" control word writes through the memory buffer to a downstream memory device. In particular, the host's (e.g., memory controller) control word write mechanism may be used to initialize a conventional JEDEC memory buffer, but there are no extra signaling mechanisms available for the host to inform the memory buffer that the control word write is destined to a downstream device. As such, the conventional JEDEC memory buffer does not allow control word writes to a downstream JEDEC Registered DIMM (RDIMM) Register/PLL device, a downstream JEDEC Load Reduced DIMM (LRDIMM) buffer device, or a cascaded memory buffer configuration.

In comparison, the memory buffer of the present disclosure offers the capability to write to downstream RDIMMs, LRDIMMs, or cascade memory buffers. Control Word Writes are necessary to initialize the control and status registers of RDIMMs and LRDIMMs before the DDR channel to the DIMMs can be properly trained and utilized in normal operation. Cascaded memory buffers are desirable because due to factors such as electrical parasitics and other signaling considerations, memory devices cannot be located too far away physically from a memory buffer. For example, for the DDR interface, ten inches tend to be the physical limit as to how far the memory device can be located away from the memory buffer. If the distance exceeds that amount, then another memory buffer needs to be put in the signal path to serve as a repeater. As discussed above, the conventional JEDEC memory buffer does not allow cascaded memory buffers due at least in part to its inability to "forward" control word writes through the memory buffer to a downstream DIMM. Here, the memory buffer employs a control and status register (CSR) based mechanism for the host to set up the necessary addressing and data for the memory buffer to utilize when it sends control word writes to the downstream memory devices. The buffer can use either "2T" (2 DDR clock cycles) or "3T" (3 DDR clock cycles) to write to the downstream memory devices depending on the type of memory device and channel signal integrity requirements. 2T provides ½ cycle of setup and ½ cycle of hold time; 3T provides a full cycle of setup and a full cycle of hold time. These are used since the control word writes takes place before the DDR channel is "trained" (after which the output signals are aligned to clock).

In an embodiment, for RDIMM-type memory devices, control word writes are to one of 16 locations, specified by 4 address/bank address bits. The DDR3 protocol allows the "address" and data to be sent in one command cycle. For LRDIMM-type memory devices, there are up to 16 functions, each with 16 CSRs, with one specific function used to pick which set of 16 functions is the actual command destination. Thus two command writes are implemented: the first to set the destination function set of 16, and the second to write the actual CSR. The memory buffer disclosed herein also supports "broadcast" write operations so that identical control word writes to multiple DIMM-type memory devices can be executed simultaneously, saving initialization time. This is accomplished via assert the Chip Selects to multiple DIMM-type devices for the same command.

The method 750 in FIG. 11 is an illustration of the above discussions according to one embodiment. The method 750 begins with block 760, in which an IHS system needs to perform a control word write to a downstream DIMM register/PLL or LRDIMM memory buffer. The method 750 continues with block 770 in which the IHS system writes the "command," "address," and "destination(s)" to the memory buffer's proprietary CSR space using either control word writes, or the SMBus interface. The method 750 continues with block 780 in which the IHS system writes a "Go" bit to start the control word write. Separately, the method 750 includes block 790, where during initialization and training, the memory buffer needs to perform self-generated control word writes to the downstream DIMM register/PLL or LRDIMM memory buffer. Note that the block 790 and the blocks 760-780 are not executed concurrently or simultaneously. Rather, they are executed at different points in time. During initialization of the memory buffer, there is a period of time that is allocated to the memory buffer to carry out this task shown in block 790. During this time, a multiplexing operation shown in block 800 is used to ensure that the memory buffer has control. When the memory buffer is finished, it will inform the host that it is done. At this time, the multiplexing operation performed in 800 will make sure that the host will now have control.

The method 750 continues with block 810, in which based on "2T" or "3T" operating mode, 1 or ½ clock cycle of setup time is generated on the address and bank address signals. The method 750 continues with block 820, in which the signal CS1:0 is asserted to the downstream DIMM(s) for 1 clock cycle. The method 750 continues with block 830, in which based on "2T" or "3T" operating mode, 1 or ½ clock cycle of hold time is generated on the address and bank address signals.

The method 750 then proceeds to a decision block 840 to determine whether the destination is a memory buffer. If the destination is not another memory buffer, that means the memory buffer is not in a cascaded configuration. Thus, if the answer returned by the decision block 840 is no, the method 750 finishes. On the other hand, if the memory buffer is cascaded with another memory buffer, then the answer returned by the decision block 840 will be a yes. In that case, the method 750 proceeds to execute blocks 850, 860, and 870, which are substantially identical to blocks 810, 820, and 830, respectively. In essence, blocks 810-830 are executed again for the downstream cascaded memory buffer.

Figure 12:
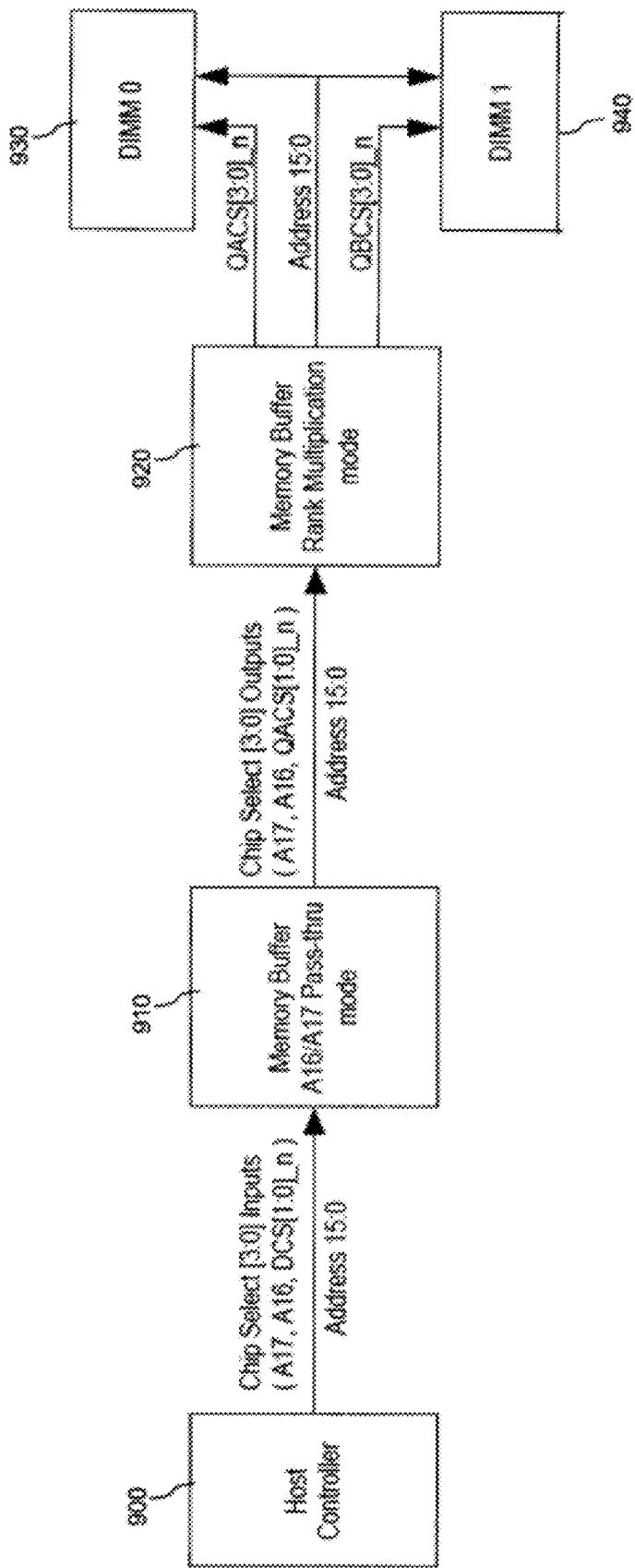
FIG. 12 is a simplified block diagram of circuitries used to support a transparent memory buffer according to various aspects of the present disclosure.

FIG. 12 is a simplified block diagram showing components that can be used to carry out the added functionality "A16/A17 Pass-through mode to allow Rank Multiplication on BoB and LRDIMMs" of Table 1. For a conventional JEDEC memory buffer in a normal mode (or direct mode) of operation, the host can generate an 8-bit chip-select command signal in order to access a specific rank of memory downstream, wherein each of the 8 bits is selecting a rank of memory. The conventional JEDEC memory buffer maps the input chip-select signal DCS[7:0]_n to the output chip-select signals QACS[3:0] and QBCS[3:0] according to the decoding scheme shown in Table 2 above. For a conventional JEDEC memory buffer in a rank multiplication mode of operation, only the lower 4 bits of the host's chip-select signal DCS[3:0]_n are used, where bits 3:2 are redefined to be address lines A17:A16, which is in addition to the standard 16 address lines 0:15. Bits 1:0 are still standard chip selects. In this case, the host sends an 18-bit address signal with A17:

A16 on DCS3:2 and A15:0 on the standard address lines. The memory buffer then maps the input to a set of output chip-select signals in accordance with Table 2.

As discussed above, the conventional JEDEC memory buffer does not support cascaded memory buffers. In comparison, the memory buffer disclosed herein does offer support for cascaded memory buffers. One example of such cascaded memory buffer scheme is shown in FIG. 12. A host (memory controller) 900 sends chip select and address signals to a memory buffer 910. The memory buffer 910 serves as a "transparent" buffer, or is said to be in a pass-through mode of operation. In other words, it does not decode anything or map any signals. It merely passes through the incoming signals to its output. The passed-through signals then go into a memory buffer 920 that is in a rank multiplication mode. The memory buffer 920 allows support up to 8 individual chip select outputs for 8 ranks of memory. The outputs of the memory buffer 920 then go into downstream memory devices, for example DIMM devices 930 and 940 shown in FIG. 12.

This configuration shown in FIG. 12 allows a full complement of UDIMMs, RDIMMs, and LRDIMMs to be supported, which would not be possible without the transparent memory buffer 910. If the memory buffer 910 is not transparent, meaning it does not have the pass-through mode, then its outputs would generate output chip-select signals based on the input chip-select signals (sent from the host 900), and the memory buffer 920 would not see the proper encoding on its inputs to allow it to do the rank multiplication appropriately. It is understood that the pass-through mode of decoding can be carried out using the BitMap selection registers discussed above with reference to FIGS. 6-8. Thus, no additional circuitry is needed to perform the pass-through decoding for the memory buffer 910.

Figure 13:
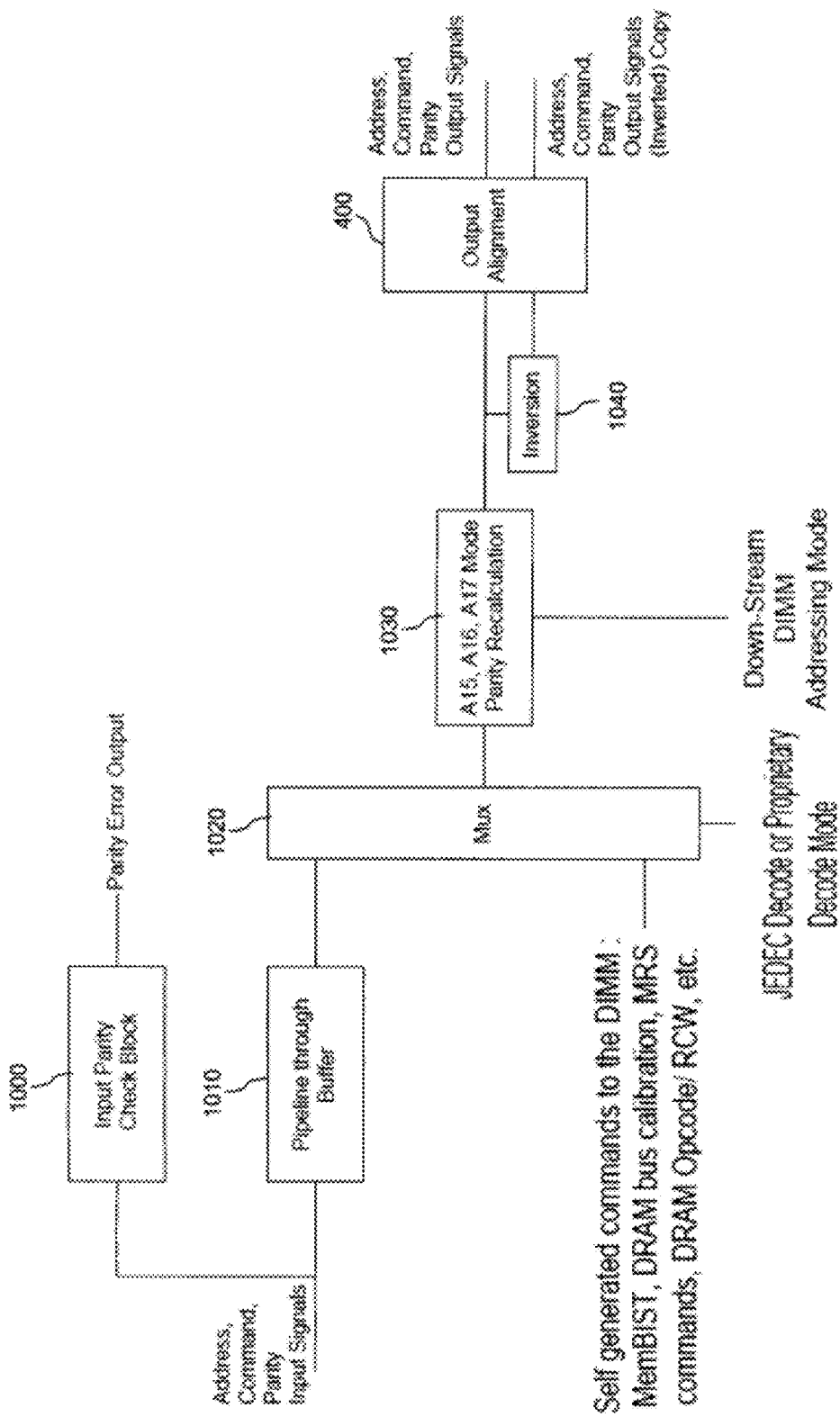
FIG. 13 is a simplified block diagram of circuitries that can be used to handle the generation and checking of new parity signals.

FIG. 13 is a simplified block diagram showing components that can be used to carry out the added functionality "Parity Signal Output for RDIMMs and LRDIMMs" of Table 1. In the memory buffer, address/command and input parity signals (from the memory controller output) are checked for correct parity, and an error is captured if the parity is not correct. This intermediate error capture allows the IHS system to determine if a parity error occurred between the CPU and the memory buffer, or between the memory buffer and the downstream DIMM. The memory buffer may provide a parity error counter, capture the address/command for retrieval by the system error handling code, etc. These input parity signals may be checked by an input parity check block 1000 shown in FIG. 13.

These input address/command/parity signals also get pipelined through a pipeline block 1010. The pipeline block 1010 contains logic timing circuitries that ensure the host's address/command/parity signals are properly "pipelined" through the memory buffer in a manner such that they are all timing-aligned within a clock cycle. A multiplexer 1020 (similar to the multiplexer 580 shown in FIGS. 6-8) can be used to select these pipelined address/command/parity signals from the memory controller when the multiplexer is in the standard JEDEC decode mode, or select the buffer-generated signals in the proprietary decode mode. In particular, during initialization and training and special test modes, the memory buffer generates its own set of address/command signals and also generates its own correct parity out signals. The multiplexer 1020 is used to intelligently multiplex the host's address/command/parity signals with the memory buffer's own self-generated address/command/parity signals.

A parity recalculation block 1030 is coupled to the output of the multiplexer 1020. The parity recalculation block calculates the new parity signal APAROUT (shown in FIG. 4). The parity recalculation is necessary to factor in the effects of rank multiplication, where the input address+CS signals may differ from the output address+CS signals. Thereafter, the inversion block 1040 inverts the signal APAROUT into the signal BPAROUT, which is always an inverted copy of APAROUT. The two new parity signals APAROUT and BPAROUT (along with other address/command signals) are then sent to the output alignment block 400.

One of the novel features of the memory buffer disclosed herein is its ability to the generate parity to the DIMMs based on the buffer operating mode. This is desirable because LRDIMMs require knowledge of whether A16 and A17 are included in the parity calculation check. If the memory buffer is in rank multiplication mode RM2 or RM4, and the DIMM is in direct mode (RM1), the memory buffer regenerates parity before sending to the DIMMs. Finally, parity is sent out with both standard and inverted polarity to the "A" and "B" copies of the address/command/parity out output signals and may also need minor output alignment adjustment to provide proper setup and hold times at the DIMMs.

In another embodiment, instead of pipelining the input parity and performing parity re-calculation 1030, the buffer may choose to generate the APAROUT without remembering the states of the address and CS and parity signals as they were received. In this case parity checking block 1000 is still used to detect input side parity errors, but the buffer generates APAROUT entirely based on the state of the address and CS signals coming from block 1020, plus the downstream addressing mode.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus, comprising:
a memory buffer that is compatible with a Joint Electron Devices Engineering Council (JEDEC) standard, wherein the memory buffer includes:
a decoder that receives an input command signal as its input and generates a first output command signal as its output;
a register component that receives the input command signal as its input and generates a second output command signal as its output; and
a multiplexer that receives a control signal as its control input and receives both the first output command signal and the second output command signal as its data input, wherein the control signal configures the multiplexer to operate in one of a JEDEC decode mode in which the multiplexer routes the first output command signal to the output of the multiplexer, and a proprietary decode mode in which the multiplexer routes the second output command signal to the output of the multiplexer.

2. The apparatus of claim 1, wherein:
the input command signal is received from a central processing unit (CPU) and is selected from the group consisting of: a chip-select input signal, a clock-enable input signal, and an on-die termination input signal;
the first output command signal is selected from the group consisting of: a plurality of first chip-select output signals, a plurality of first clock-enable output signals, and a plurality of first on-die termination output signals; and the second output command signal is selected from the group consisting of: a plurality of second chip-select output signals, a plurality of second clock-enable output signals, and a plurality of second on-die termination output signals.

3. The apparatus of claim 1, wherein the first output command signal contains a different bit pattern from the second output command signal.

4. The apparatus of claim 1, wherein:
the input command signal includes an N number of bits, N being an integer;
the register component includes the N number of BitMap registers that each contain a plurality of bit fields; and
each bit of the input command signal is coupled to a respective one of the BitMap registers so as to serve as an enable input to that BitMap register.

5. The apparatus of claim 4, wherein the register component generates the second output command signal by programming the bit fields in response to a desired configuration of a downstream memory device.

6. The apparatus of claim 1, wherein the first and second output command signals each contain twice as many bits as the input command signal.

7. The apparatus of claim 1, further including an output alignment component coupled to the output of the multiplexer, wherein the output alignment component is operable to adjust a timing delay of one of: the first output command signal and the second output command signal.

8. A method, comprising:
generating, using a decoder, a first output command signal in response to an input command signal;
generating, using a register component, a second output command signal in response to the input command signal; and
selecting one of the first output command signal and the second output command signal to be outputted in response to a control signal, wherein the selecting is carried out so that the first output command signal is selected if the control signal indicates that a standard Joint Electron Devices Engineering Council (JEDEC) decode mode is chosen, and the second output command signal is selected if the control signal indicates that a proprietary decode mode is chosen.

9. The method of claim 8, wherein:
the generating the first output command signals includes mapping the input command signal to the first output command signal according to a predetermined decoding table; and
the generating the second output command signal includes programming arbitrary values into the register component in response to an optimization priority.

10. The method of claim 9, wherein the decoder and the register component are implemented on a memory buffer compatible with a JEDEC standard, and wherein the decoding table is a JEDEC decoding table that determines how a chip-select signal, a clock-enable signal, and an on-die termination signal should be mapped from an input to the memory buffer to the output of the memory buffer.

11. The method of claim 10, wherein:
if the optimization priority is optimization for memory performance, then the generating the second output command signal includes programming the register component in a manner so as to remap the chip-select signal, the clock-enable signal, and the on-die termination signal for a highest rank interleave across a plurality of downstream memory devices that are coupled to the memory buffer;

if the optimization priority is optimization for power consumption, then the generating the second output command signal includes programming the register component in a manner so as to remap the chip-select signal, the clock-enable signal, and the on-die termination signal to support maximum clock-enable power down and self-refresh granularity across the plurality of downstream memory devices; and if the optimization priority is optimization for reliability/availability/serviceability, then the generating the second output command signal includes programming the register component in a manner so as to remap the chip-select signal, the clock-enable signal, and the on-die termination signal to keep consecutive ranks on the same downstream memory devices.

12. The method of claim 8, wherein:
the input command signal includes an N number of bits, N being an integer;
the register component includes N number of BitMap registers that each contain a plurality of bit fields; and
each bit of the input command signal is coupled to a respective one of the BitMap registers so as to serve as an enable input to that BitMap register.

13. The method of claim 8, further including:
outputting the selected one of the first and second output command signals to an alignment component; and
adjusting, using the alignment component, a timing delay of the selected one of the first and second output command signals.

14. A digital apparatus, comprising:
a decoder component that maps an input command signal to a first output command signal according to a predefined decoding table;
means for mapping the input command signal to a second output command signal; and
a multiplexer that selects either the first output command signal or the second output command signal to be outputted in response to a control signal, wherein the first output command signal is selected if the control signal indicates that a standard Joint Electron Devices Engineering Council (JEDEC) decode mode is chosen, and the second output command signal is selected if the control signal indicates that a proprietary decode mode is chosen.

15. The digital apparatus of claim 14, wherein the means for mapping the input command signal includes a plurality of registers that each contain a plurality of programmable bit fields, and wherein values of the bit fields are programmed to achieve a desired optimization scheme.

16. The digital apparatus of claim 14, wherein:
the decoding table is a decoding table according to a JEDEC standard;
the input command signal is received from an upstream memory controller and includes one of: a chip-select input signal, a clock-enable input signal, and an on-die termination input signal; and
the first and second output command signals contain different bit patterns.

* * * * *